(12) United States Patent
Lim et al.

(10) Patent No.: US 11,467,195 B2
(45) Date of Patent: Oct. 11, 2022

(54) VOLTAGE MONITORING DEVICE AND ELECTRONIC DEVICE INCLUDING THE SAME

(71) Applicant: Samsung Electronics Co., Ltd., Suwon-si (KR)

(72) Inventors: Cheolhwan Lim, Suwon-si (KR); Youngbin Kwon, Hwaseong-si (KR); Yongjin Lee, Goyang-si (KR); Haejung Choi, Daegu (KR); Kwangho Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 316 days.

(21) Appl. No.: 16/781,333

(22) Filed: Feb. 4, 2020

(65) Prior Publication Data
US 2020/0386796 A1 Dec. 10, 2020

(30) Foreign Application Priority Data
Jun. 7, 2019 (KR) .................. 10-2019-0067476

(51) Int. Cl.
*G01R 19/165* (2006.01)
*G01R 19/00* (2006.01)
(Continued)

(52) U.S. Cl.
CPC ....... *G01R 19/165* (2013.01); *G01R 19/0084* (2013.01); *H03K 17/223* (2013.01); *H03K 17/284* (2013.01)

(58) Field of Classification Search
CPC .............. G01R 19/165; G01R 19/0084; G01R 19/16576; G01R 19/16538;
(Continued)

(56) References Cited

U.S. PATENT DOCUMENTS 5,172,012 A 12/1992 Ueda
5,442,312 A * 8/1995 Walter ...................... G06F 1/24
327/143
(Continued)

FOREIGN PATENT DOCUMENTS

CN 101394171 A 3/2009
CN 104953993 A 9/2015
(Continued)

OTHER PUBLICATIONS

Translation of CN104953993 (Year: 2015).*
(Continued)

*Primary Examiner* — Christopher P McAndrew
(74) *Attorney, Agent, or Firm* — Harness, Dickey & Pierce, P.L.C.

(57) ABSTRACT

A voltage monitoring circuit includes an initializing circuit that outputs an initialization signal generated by delaying a power supply voltage as much as a first delay time, a switching circuit that outputs a switching signal in response to a reset signal, a voltage detecting circuit that outputs a detection signal based on the power supply voltage and stops an operation in response to the switching signal, and an output circuit that outputs the reset signal based on the initialization signal and the detection signal.

20 Claims, 16 Drawing Sheets

(51) Int. Cl.
*H03K 17/22* (2006.01)
*H03K 17/284* (2006.01)

(58) Field of Classification Search
CPC ............. G01R 19/2503; H03K 17/223; H03K 17/284; H03K 17/22; H03K 17/28
USPC ........................................................ 324/522
See application file for complete search history.

(56) References Cited

U.S. PATENT DOCUMENTS

| | | |
|---|---|---|
| 8,193,841 B2 | 6/2012 | Sareen et al. |
| 8,723,554 B2 | 5/2014 | Zanchi |
| 8,963,590 B2 | 2/2015 | Guimont et al. |
| 9,369,124 B2 | 6/2016 | Gunther et al. |
| 9,484,910 B2 | 11/2016 | Mai |
| 9,917,577 B1 | 3/2018 | Rezayee et al. |
| 10,090,833 B2 | 10/2018 | Menezes |
| 2014/0049300 A1* | 2/2014 | Lin .................. H03K 3/356191 327/143 |

FOREIGN PATENT DOCUMENTS

| | | | |
|---|---|---|---|
| CN | 104953993 B | * | 4/2018 |
| DE | 10024980 A1 | | 11/2001 |
| JP | 2010-147835 A | | 7/2010 |

OTHER PUBLICATIONS

Translation of CN101394171 (Year: 2008).*
Extended European Search Report dated Oct. 5, 2020 for Application No. EP 20155859.

* cited by examiner

VOLTAGE MONITORING DEVICE AND ELECTRONIC DEVICE INCLUDING THE SAME

CROSS-REFERENCE TO RELATED APPLICATIONS

This application claims priority under 35 U.S.C. § 119 to Korean Patent Application No. 10-2019-0067476, filed on Jun. 7, 2019, in the Korean Intellectual Property Office, the disclosure of which is incorporated by reference herein in its entirety.

BACKGROUND

Technical Field

Embodiments of the inventive concepts described herein relate to an electronic device, and more particularly, relate to a voltage monitoring device and an electronic device including the same.

Related Art

An electronic device may perform various operations by using a power provided from a power source. For example, the electronic device may determine that the power provided from the power source reaches a given level and may initiate various operations based on a result of the determination. The electronic device may use a voltage monitoring circuit for the purpose of the above-described determination operation. For example, the voltage monitoring circuit may monitor the power (or a power supply voltage) provided from the power source; and when the power (or the power supply voltage) reaches a particular level, the voltage monitoring circuit may output a particular signal. The electronic device may initiate various operations in response to the particular signal.

SUMMARY

Example embodiments of the inventive concepts provide a voltage monitoring device improving reliability and reducing power consumption and/or an electronic device including the same.

According to an example embodiment, a voltage monitoring circuit includes an initializing circuit configured to generate an initialization signal by delaying a power supply voltage by a first delay time; a switching circuit configured to generate a switching signal in response to a reset signal; a voltage detecting circuit configured to perform an operation to generate a detection signal based on the power supply voltage, and to stop the operation in response to the switching signal; and an output circuit configured to generate the reset signal in response to the initialization signal and the detection signal.

According to an example embodiment, a voltage monitoring circuit includes a first PMOS transistor connected between a first node and a second node, the first PMOS transistor configured to operate in response to a reset signal; a first NMOS transistor connected between the first node and a ground node, the first NMOS transistor configured to operate in response to the reset signal; a first resistor connected between a power node receiving a power supply voltage and the second node; a second resistor connected between the second node and a third node; a second NMOS transistor connected between the third node and the ground node, the second NMOS transistor configured to operate in response to a level of the first node; an inverter configured to output a detection signal based on a level of the third node; a second PMOS transistor connected between the power node and an initialization signal node outputting an initialization signal, the second PMOS transistor configured to operate in response to a level of a fourth node; a first capacitor connected between the initialization signal node and the fourth node; a third NMOS transistor connected between the power node and the initialization signal node, the third NMOS transistor configured to operate in response to the initialization signal; and an output circuit configured to output the reset signal in response to the initialization signal and the detection signal.

According to an example embodiment, an electronic device includes a plurality of function blocks configured to operate based on a power supply voltage, in response to a reset signal; and a voltage monitoring circuit configured to output the reset signal when the power supply voltage reaches a set level, the voltage monitoring circuit including, an initializing circuit configured to generate an initialization signal by delaying the power supply voltage by a first delay time, a switching circuit configured to generate a switching signal such that the switching signal corresponds to one of the power supply voltage or a ground voltage in response to the reset signal, a voltage detecting circuit configured to perform an operation to generate a detection signal based on the power supply voltage, and to stop the operation in response to the switching signal, and an output circuit configured to generate the reset signal in response to the initialization signal and the detection signal.

BRIEF DESCRIPTION OF THE FIGURES

The above and other objects and features of the inventive concepts will become apparent by describing in detail example embodiments thereof with reference to the accompanying drawings.

DETAILED DESCRIPTION

Below, example embodiments of the inventive concepts may be described in detail and clearly to such an extent that an ordinary one in the art easily implements the inventive concepts.

Figure 1:
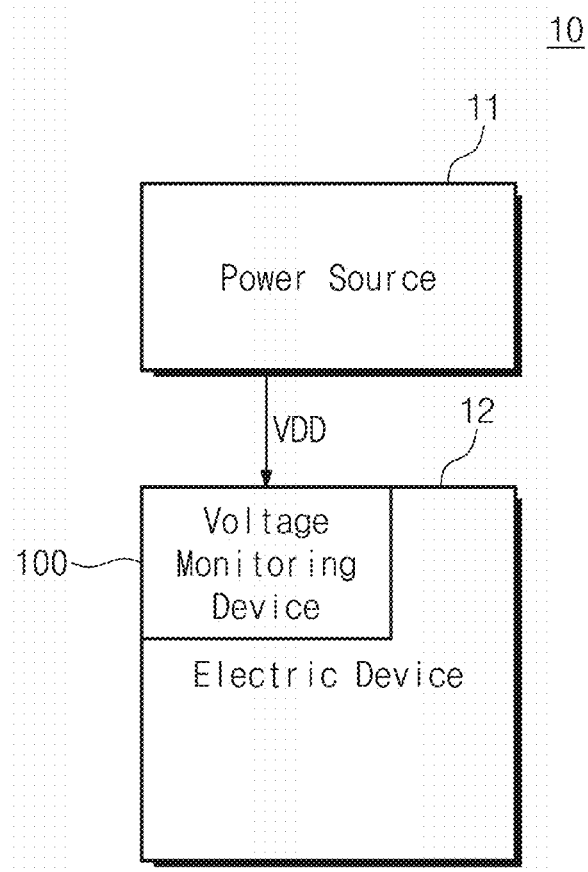
FIG. 1 is a block diagram illustrating a user system according to an example embodiment of the inventive concepts.

FIG. 1 is a block diagram illustrating a user system according to an example embodiment of the inventive concepts.

Referring to FIG. 1, a user system 10 may include a power source 11 and an electronic device 12. In an example embodiment, the user system 10 may be one of the following devices or a combination of two or more thereof: a smartphone, a tablet personal computer (PC), a mobile phone, a video phone, an e-book reader, a desktop PC, a laptop PC, a netbook computer, a personal digital assistant (PDA), a portable multimedia player (PMP), a MP3 player, a mobile medical device, an electronic bracelet, an electronic necklace, an electronic accessory, a camera, a wearable device, an electronic clock, a wrist watch, a home appliance (e.g., a refrigerator, an air conditioner, a vacuum cleaner, an oven, an microwave oven, a washing machine, an air cleaner, or the like), an artificial intelligence robot, a television (TV), a digital video disk (DVD) player, an audio system, various kinds of medical devices (e.g., magnetic resonance angiography (MRA), magnetic resonance imaging (MRI), computed tomography (CT), a ultrasonic machine, or the like), a navigation device, a global positioning system (GPS) receiver, an event data recorder (EDR), a flight data recorder (FDR), a set-top box, a TV box (e.g., Samsung HomeSync™, AppleTV™, or googleTV™), an electronic dictionary, a car infotainment device, electronic equipment for ship (e.g., a navigation system for ship, a gyrocompass, or the like), an avionics system, a security device, electronic clothes, an electronic key, a camcorder, a game console, a head-mounted display (HMD), a flat panel display device, an electronic picture frame, an electronic album, furniture or a part of a building or a structure, which includes a communication function, an electronic board, an electronic signature receiving device, and a projector.

The power source 11 may be configured to provide a power VDD (hereinafter referred to as a "power supply voltage VDD") necessary for the electronic device 12 to operate. For example, the power source 11 may be a power device, which is configured to store electrical energy, such as a battery or a capacitor or may be an energy harvesting power device that harvests electrical energy from various energy sources.

The electronic device 12 may be provided with the power supply voltage VDD from the power source 11. The electronic device 12 may be configured to perform various operations by using the power supply voltage VDD. In an example embodiment, the electronic device 12 may operate when the power supply voltage VDD reaches a particular level. For example, when the power supply voltage VDD starts to be supplied from the power source 11, the power supply voltage VDD may gradually increase to the particular level. When a voltage level of the power supply voltage VDD reaches a particular voltage, the electronic device 12 may perform various operations by using the power supply voltage VDD.

The electronic device 12 according to an example embodiment of the inventive concepts may include a voltage monitoring device 100. The voltage monitoring device 100 may be configured to monitor a level of the power supply voltage VDD from the power source 11. For example, the voltage monitoring device 100 may output a particular signal when the power supply voltage VDD reaches the particular level. The electronic device 12 or various components (e.g., an IP block and a processing unit) included in the electronic device 12 may perform various operations in response to the particular signal from the voltage monitoring device 100. Below, detailed structures and operations of the voltage monitoring device 100 will be described with reference to accompanying drawings.

Figure 2:
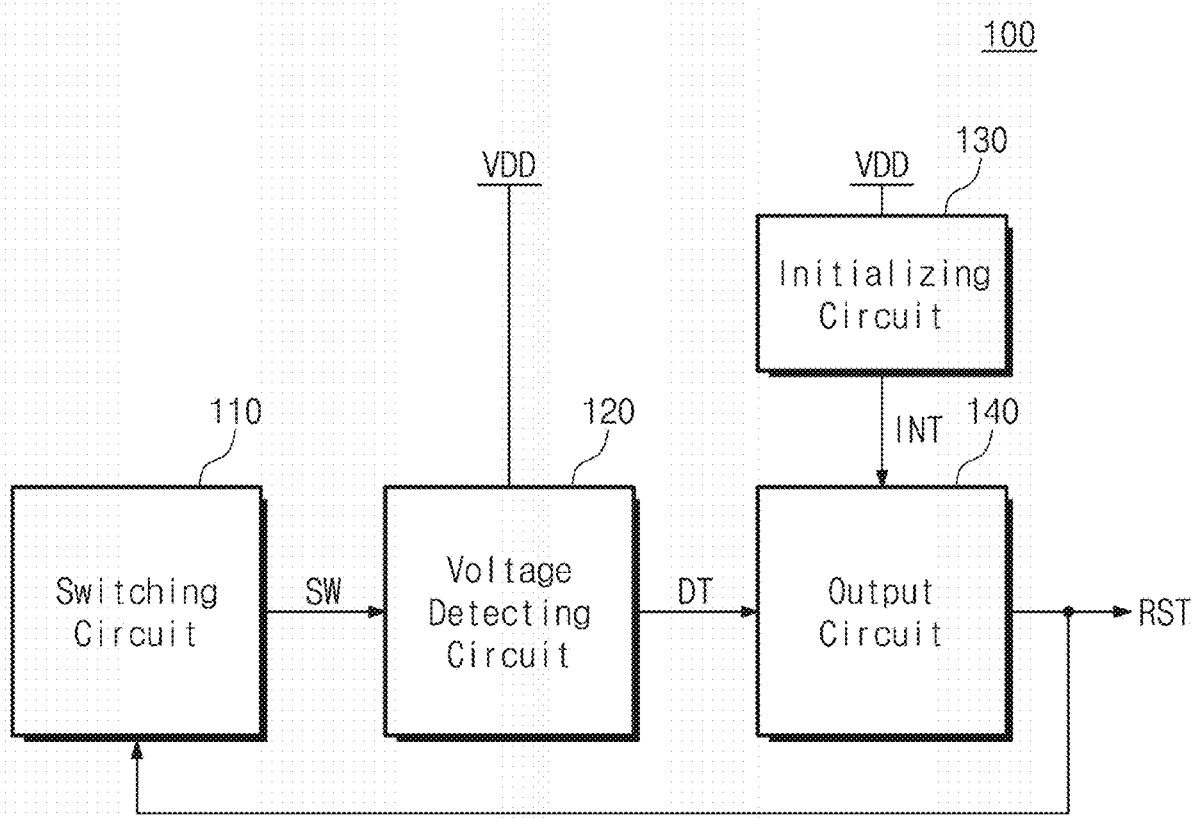
FIG. 2 is a block diagram illustrating a voltage monitoring device of FIG. 1.

FIG. 2 is a block diagram illustrating a voltage monitoring device of FIG. 1. Referring to FIGS. 1 and 2, the voltage monitoring device 100 may include a switching circuit 110, a voltage detecting circuit 120, an initializing circuit 130, and an output circuit 140.

The switching circuit 110 may operate in response to a reset signal RST output from the output circuit 140. For example, the switching circuit 110 may receive the reset signal RST from the output circuit 140 and may output a switching signal SW in response to the reset signal RST. In an example embodiment, the switching signal SW may be a signal corresponding to the power supply voltage VDD.

The voltage detecting circuit 120 may receive the switching signal SW from the switching circuit 110, may receive the power supply voltage VDD, and may output a detection signal DT in response to the switching signal SW and the power supply voltage VDD. In an example embodiment, the detection signal DT may have a level of logic high "HIGH" under a particular condition. For example, the detection signal DT may transition to logic high "HIGH" when the power supply voltage VDD reaches the particular level or a voltage of the switching signal SW reaches a reference voltage VREF.

The initializing circuit 130 may output an initialization signal INT in response to the power supply voltage VDD. For example, the initializing circuit 130 may delay the power supply voltage VDD as much as a particular time, and the delayed power supply voltage VDD may be output as the initialization signal INT. In an example embodiment, the particular time by which the power supply voltage VDD is delayed by the initializing circuit 130 may be determined by an RC delay in the initializing circuit 130.

The output circuit 140 may receive the initialization signal INT from the initializing circuit 130 and may receive the detection signal DT from the voltage detecting circuit 120. The output circuit 140 may output the reset signal RST based on the initialization signal INT and the detection signal DT.

In an example embodiment, in an initial period where the power supply voltage VDD starts to increase (hereinafter referred to as an "initial period of the power supply voltage VDD"), the output circuit 140 may output the reset signal RST of logic low "LOW" in response to the initialization signal INT. That is, in the initial period of the power supply voltage VDD, the reset signal RST that is output from the output circuit 140 may maintain logic low "LOW" through the initializing circuit 130. In an example embodiment, the initial period of the power supply voltage VDD may indicate a period that starts from a time when the power supply voltage VDD starts to increase from 0 V or may indicate a period where the power supply voltage VDD increases from 0 V to the particular level.

The switching circuit 110 may output the switching signal SW corresponding to the power supply voltage VDD in response to the reset signal RST of logic low "LOW". In the initial period of the power supply voltage VDD, the reset signal RST may be set to a particular level (e.g., logic low "LOW") by the initializing circuit 130, and the switching circuit 110 may output the switching signal SW corresponding to the power supply voltage VDD in response to the reset signal RST set to the particular level. As such, the reliability of operation of the voltage monitoring device 100 may be improved in the initial period of the power supply voltage VDD.

In an example embodiment, when the power supply voltage VDD reaches the particular level, the voltage detecting circuit 120 may output the detection signal DT of logic high "HIGH". The output circuit 140 may output the reset signal RST of logic high "HIGH" in response to the detection signal DT of logic high "HIGH". When the reset signal RST transitions to logic high "HIGH", the switching circuit 110 may output the switching signal SW of logic low "LOW". Afterwards, the voltage detecting circuit 120 may stop an operation in response to the switching signal SW of logic low "LOW". In an example embodiment, that the operation of the voltage detecting circuit 120 is stopped may mean that a current does not flow through the voltage detecting circuit 120. Even though the operation of the voltage detecting circuit 120 is stopped, the output circuit 140 may maintain the reset signal RST at logic high "HIGH".

As described above, the voltage monitoring device 100 according to an example embodiment of the inventive concepts may secure the reliability of operation of the switching circuit 110 through the initializing circuit 130 in the initial period of the power supply voltage VDD. Further, the voltage monitoring device 100 may decrease the amount of current that is consumed by the voltage monitoring device 100, by stopping the operation of the voltage detecting circuit 120 after the power supply voltage VDD reaches the particular level.

In an example embodiment, levels or logical values of various signals described above are an example for describing an example embodiment of the inventive concepts clearly, and the inventive concepts are not limited thereto.

Figure 3:
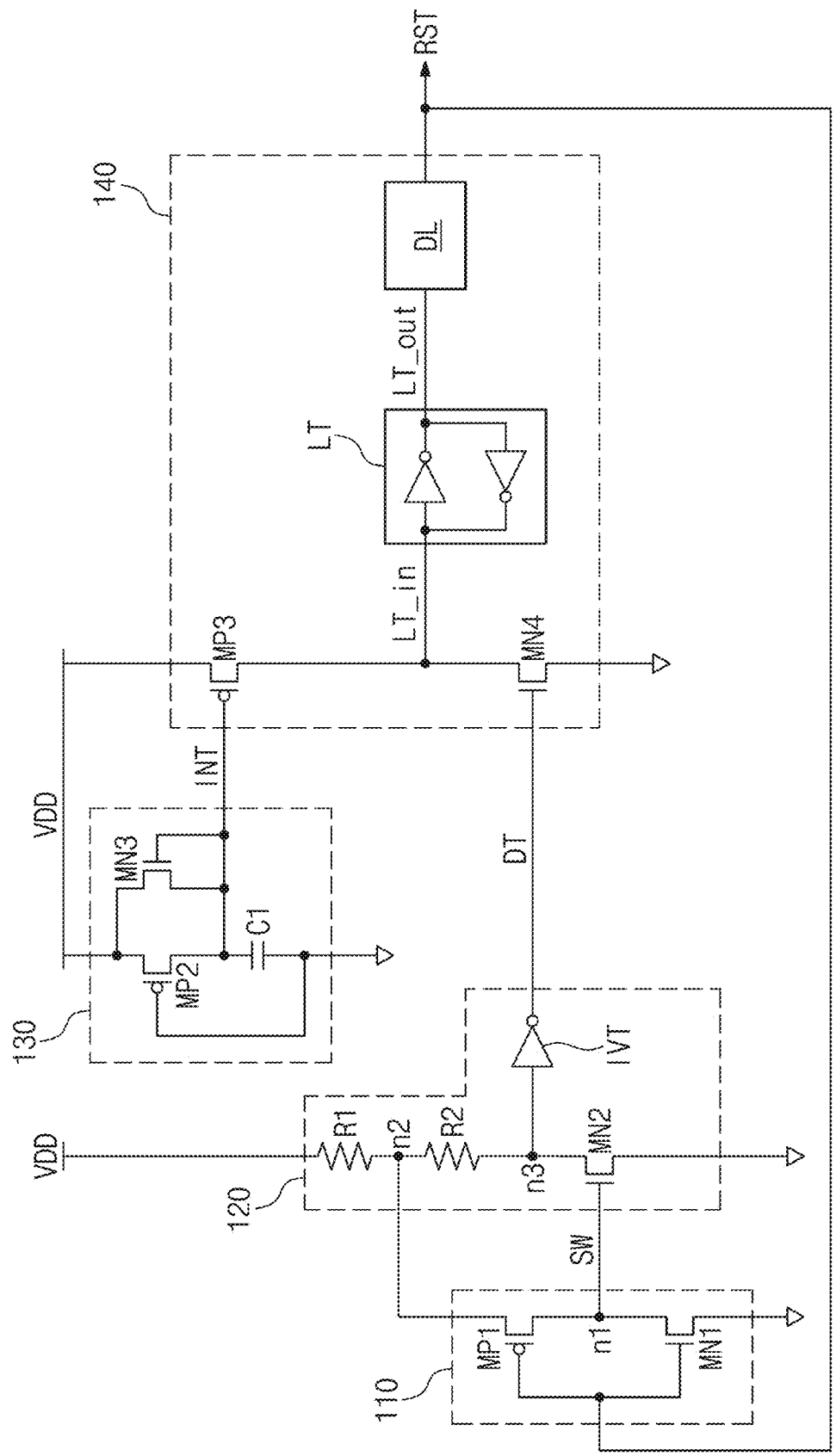
FIG. 3 is a circuit diagram illustrating a voltage monitoring device of FIG. 2 in detail.
Figure 4:
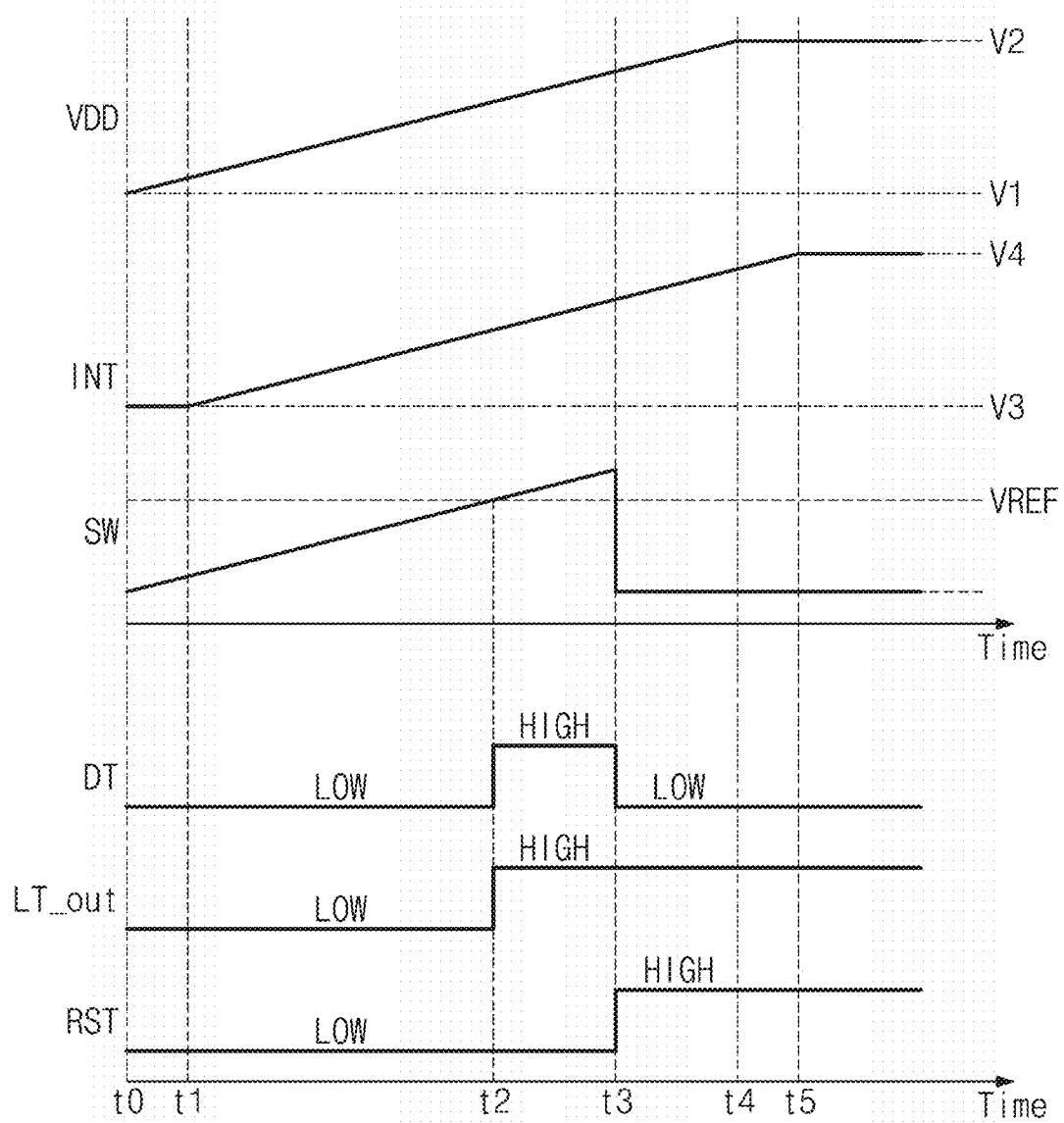
FIG. 4 is a timing diagram for describing an operation of a voltage monitoring device FIG. 3.

FIG. 3 is a circuit diagram illustrating a voltage monitoring device of FIG. 2 in detail. FIG. 4 is a timing diagram for describing an operation of a voltage monitoring device FIG. 3.

In an example embodiment, a circuit diagram illustrated in FIG. 3 is an example for describing an example embodiment of the inventive concepts clearly, and the inventive concepts are not limited thereto. For example, the circuit diagram illustrated in FIG. 3 may be equivalently variously changed or modified to perform the same function or similar functions without departing from the scope of the inventive concepts.

Referring to FIGS. 2 and 3, the voltage monitoring device 100 may include the switching circuit 110, the voltage detecting circuit 120, the initializing circuit 130, and the output circuit 140.

The switching circuit 110 may include a first PMOS transistor MP1 and a first NMOS transistor MN1. The first PMOS transistor MP1 may be connected between a first node n1 and a second node n2 and may operate in response to the reset signal RST from the output circuit 140. The first NMOS transistor MN1 may be connected between the first node n1 and a ground node and may operate in response to the reset signal RST from the output circuit 140. The first node n1 may indicate a node from which the switching signal SW is output.

The voltage detecting circuit 120 may include a first resistor R1, a second resistor R2, a second NMOS transistor MN2, and an inverter IVT. The first resistor R1 may be connected between a power node (i.e., a node to which the power supply voltage VDD is supplied) and the second node n2. The second resistor R2 may be connected between the second node n2 and a third node n3. The second NMOS transistor MN2 may be connected between the third node n3 and the ground node and may operate in response to the switching signal SW. The inverter IVT may invert a signal of the third node n3 and may output the inverted signal as the detection signal DT.

The initializing circuit 130 may include a second PMOS transistor MP2, a third NMOS transistor MN3, and a first capacitor C1. The second PMOS transistor MP2 may be connected between the power node and an output node of the initializing circuit 130 (i.e., an initialization node from which the initialization signal INT is output) and may operate in response to a level of the ground node. The third NMOS transistor MN3 may be connected between the power node and the output node of the initializing circuit 130 and may operate in response to a level of an output node of the initializing circuit 130. The first capacitor C1 may be connected between the initialization node and the ground node.

The output circuit 140 may include a third PMOS transistor MP3, a fourth NMOS transistor MN4, a latch LT, and a delay unit DL. The third PMOS transistor MP3 may be connected between the power node and a latch input node LT_in and may operate in response to the initialization signal INT from the initializing circuit 130. The fourth NMOS transistor MN4 may be connected between the latch input node LT_in and the ground node and may operate in response to the detection signal DT. The latch LT may be connected between the latch input node LT_in and a latch output node LT_out and may be configured to hold, store, or latch a level of the latch input node LT_in. The delay unit DL may delay a signal of the latch output node LT_out as much as a delay time and may output the delayed signal as the reset signal RST. In an example embodiment, the delay time of the delay unit DL may be in advance determined by a structure of the voltage monitoring device 100, a level of the power supply voltage VDD, etc.

An operation of the voltage monitoring device 100 illustrated in FIG. 3 will be more fully described with reference to FIG. 4. In an example embodiment, a timing diagram illustrated in FIG. 4 is an example for describing an example embodiment of the inventive concepts clearly, and the inventive concepts are not limited thereto. Also, the timing diagram of FIG. 4 is schematically illustrated, and actual signal or voltage waveforms may be different from those illustrated in FIG. 4.

Below, the terms "initial period of the power supply voltage VDD" and "stable period of the power supply voltage VDD" are used for convenience of description. The initial period of the power supply voltage VDD may mean a period from a time when the power supply voltage VDD starts to increase to a time when the power supply voltage VDD reaches a particular level, and the stable period of the power supply voltage VDD may mean a period after the power supply voltage VDD reaches the particular level.

However, the terms are to describe the technical idea of the inventive concepts easily, and the inventive concepts are not limited thereto.

Referring to FIGS. 3 and 4, at a 0-th time t0, the power supply voltage VDD may be a first voltage V1. Afterwards, the power supply voltage VDD may increase from the first voltage V1 to a second voltage V2 during a period from the 0-th time t0 to a fourth time t4. In an example embodiment, the first voltage V1 may be 0 V, and the second voltage V2 may be a rated voltage supported from the power source 11.

During the initial period of the power supply voltage VDD (e.g., a period from the 0-th time t0 to the first time t1 or a period from the 0-th time t0 to a second time t2), the initialization signal INT may not increase or may increase to be lower than the power supply voltage VDD. That is, the initialization signal INT may increase from a third voltage V3 to a fourth voltage V4 during a period from the first time t1 to the fifth time t5.

For example, in the initial period of the power supply voltage VDD, the second PMOS transistor MP2 of the initializing circuit 130 may be turned on in response to a level of the ground node, and thus, the first capacitor C1 may be charged by the power supply voltage VDD. The configuration of the initializing circuit 130 may appear as an RC delay associated with the power supply voltage VDD. That is, compared with the power supply voltage VDD, the initialization signal INT may be delayed as much as a given time and may slowly increase. That is, in the initial period of the power supply voltage VDD, there may be a difference between the power supply voltage VDD and the initialization signal INT as much as a desired (or, alternatively, a predetermined) level. In an example embodiment, a delay time that appears by the initializing circuit 130 may correspond to an RC-delay time generated by respective elements included in the initializing circuit 130.

The third PMOS transistor MP3 of the output circuit 140 may be turned on by a level difference between the power supply voltage VDD and the initialization signal INT. As the third PMOS transistor MP3 is turned on, the power supply voltage VDD may be provided to the latch input node LT_in. As such, the latch output node LT_out may be set to logic low "LOW" by an operation of the latch LT. Because the latch output node LT_out is set to logic low "LOW", the reset signal RST that is output from the delay unit DL may be set to logic low "LOW". That is, in the initial period of the power supply voltage VDD, the reset signal RST may maintain a level of logic low "LOW" by the operation of the initializing circuit 130.

The switching circuit 110 may output the switching signal SW in response to the reset signal RST of logic low "LOW". The switching signal SW may be provided to a gate of the second NMOS transistor MN2 of the voltage detecting circuit 120. For example, the first PMOS transistor MP1 of the switching circuit 110 may be turned on in response to the reset signal RST of logic low "LOW", and the first NMOS transistor MN1 of the switching circuit 110 may be turned off in response to the reset signal RST of logic low "LOW". As such, the switching signal SW may have a voltage that is obtained by dividing the power supply voltage VDD through the first and second resistors R1 and R2. That is, in the initial period of the power supply voltage VDD, the switching signal SW may be a signal corresponding to the power supply voltage VDD or a signal corresponding to a voltage obtained by dividing the power supply voltage VDD through the first and second resistors R1 and R2.

That is, as described above, in the initial period of the power supply voltage VDD, the reset signal RST may maintain a level of logic low "LOW" by the operation of the initializing circuit 130, and thus, the switching circuit 110 may normally operate. In other words, the reliability of operation of the switching circuit 110 in the initial period of the power supply voltage VDD may be secured.

Afterwards, as the first PMOS transistor MP1 of the switching circuit 110 is turned on, the switching signal SW may follow the power supply voltage VDD. In an example embodiment, at the second time t2, the switching signal SW may reach a reference voltage VREF. In this case, the second NMOS transistor MN2 of the voltage detecting circuit 120 may be turned on. As the second NMOS transistor MN2 is turned on, a voltage level of the third node n3 may decrease to a ground voltage. In this case, the inverter IVT of the voltage detecting circuit 120 may output the detection signal DT of logic high "HIGH".

In an example embodiment, the reference voltage VREF may indicate a threshold voltage capable of turning on the second NMOS transistor MN2 of the voltage detecting circuit 120. In an example embodiment, the reference voltage VREF may be determined by various physical characteristics (e.g., a channel size, a doping concentration, etc.) of the second NMOS transistor MN2. Resistance values of the first and second resistors R1 and R2 may be determined such that the switching signal SW reaches the reference voltage VREF when the power supply voltage VDD reaches a particular level.

The fourth NMOS transistor MN4 of the output circuit 140 may be turned on in response to the detection signal DT of logic high "HIGH", and thus, a voltage level of the latch input node LT_in may decrease to the ground voltage. In this case, the latch output node LT_out may be set to logic high "HIGH" by the operation of the latch LT, and the delay unit DL may delay a signal of the latch output node LT_out as much as a given time (e.g., t2 to t3) to output the reset signal RST of logic high "HIGH".

In other words, at the second time t2, the switching signal SW may reach the reference voltage VREF, and thus, the voltage detecting circuit 120 may output the detection signal DT of logic high "HIGH". At the second time t2, the latch output node LT_out may increase to logic high "HIGH" by the detection signal DT of logic high "HIGH", and the delay unit DL may delay a signal of the latch output node LT_out as much as the given time to output the reset signal RST of logic high "HIGH".

At the third time t3, the first PMOS transistor MP1 of the switching circuit 110 may be turned off by the reset signal RST of logic high "HIGH", and the first NMOS transistor MN1 of the switching circuit 110 may be turned on by the reset signal RST of logic high "HIGH". At the third time t3, as the first NMOS transistor MN1 is turned on, the switching signal SW may decrease to the ground voltage. In this case, the second NMOS transistor MN2 of the voltage detecting circuit 120 may be turned off in response to the switching signal SW decreased to the ground voltage. As the second NMOS transistor MN2 of the voltage detecting circuit 120 is turned off, a current flowing through the voltage detecting circuit 120 may be blocked. That is, the operation of the voltage detecting circuit 120 may be stopped. In an example embodiment, even though the operation of the voltage detecting circuit 120 is stopped, the reset signal RST may maintain logic high "HIGH" by the latch LT.

As described above, the voltage monitoring device 100 according to an example embodiment of the inventive concepts may improve the reliability of operation of the switching circuit 110 by maintaining the reset signal RST at a particular level (e.g., a low level LOW) by using the initializing circuit 130 in the initial period of the power supply voltage VDD. Also, the voltage monitoring device 100 may reduce current consumption by stopping the operation of the voltage detecting circuit 120 when the power supply voltage VDD reaches a particular level (or when the switching signal SW reaches the reference voltage VREF). Accordingly, there is provided a voltage monitoring device having improved reliability and reducing power consumption.

Although not illustrated clearly in drawings, in a situation where the power supply voltage VDD decreases from the second voltage V2 to the first voltage V1 (i.e., in a power-off situation), the third NMOS transistor MN3 of the initializing circuit 130 may be configured to discharge charges stored in the first capacitor C1. That is, in the power-off situation, as the first capacitor C1 is discharged, the initializing circuit 130 may normally operate in a next power-off situation.

Figure 5:
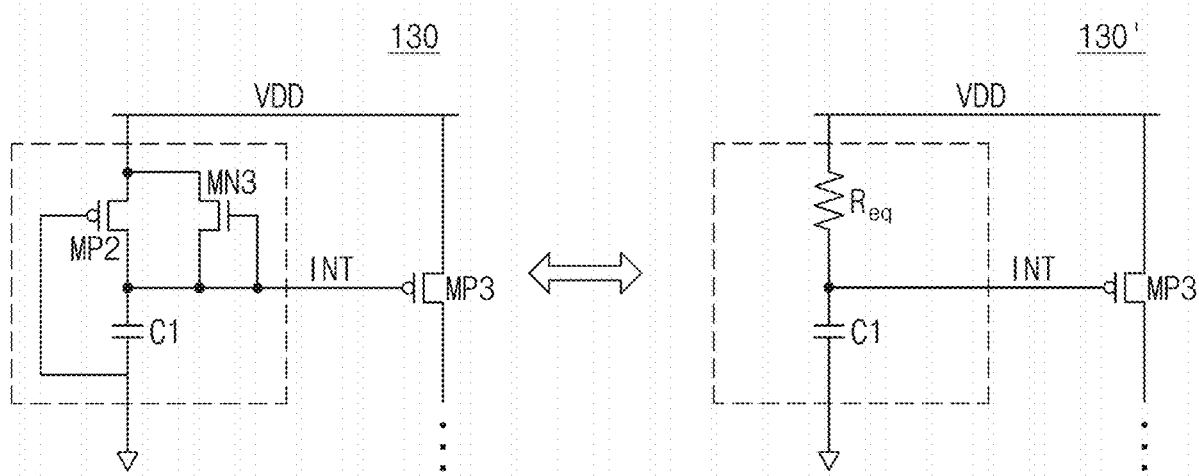
FIG. 5 is a diagram for describing an equivalent circuit of an initializing circuit of FIG. 3.

FIG. 5 is a diagram for describing an equivalent circuit of an initializing circuit of FIG. 3. Referring to FIGS. 3 and 5, the initializing circuit 130 may include the second PMOS transistor MP2, the third NMOS transistor MN3, and the first capacitor C1. However, the inventive concepts are not limited thereto.

For example, as illustrated in FIG. 5, an initializing circuit 130' may be expressed by an equivalent circuit of an equivalent resistor $R_{eq}$ and the first capacitor C1 connected in series between a power node (i.e., a node to which the power supply voltage VDD is applied) and a ground node. The initialization signal INT may be output through a node between the equivalent resistor $R_{eq}$ and the first capacitor C1. That is, the initializing circuit 130' may be an RC-delay circuit configured to delay the power supply voltage VDD as much as a given time.

In other words, the initializing circuit 130 according to an example embodiment of the inventive concepts are not limited to configurations illustrated in drawings. For example, the initializing circuit 130 may be variously modified or changed in the form of any circuit capable of generating the initialization signal INT by RC-delaying the power supply voltage VDD.

Figure 6:
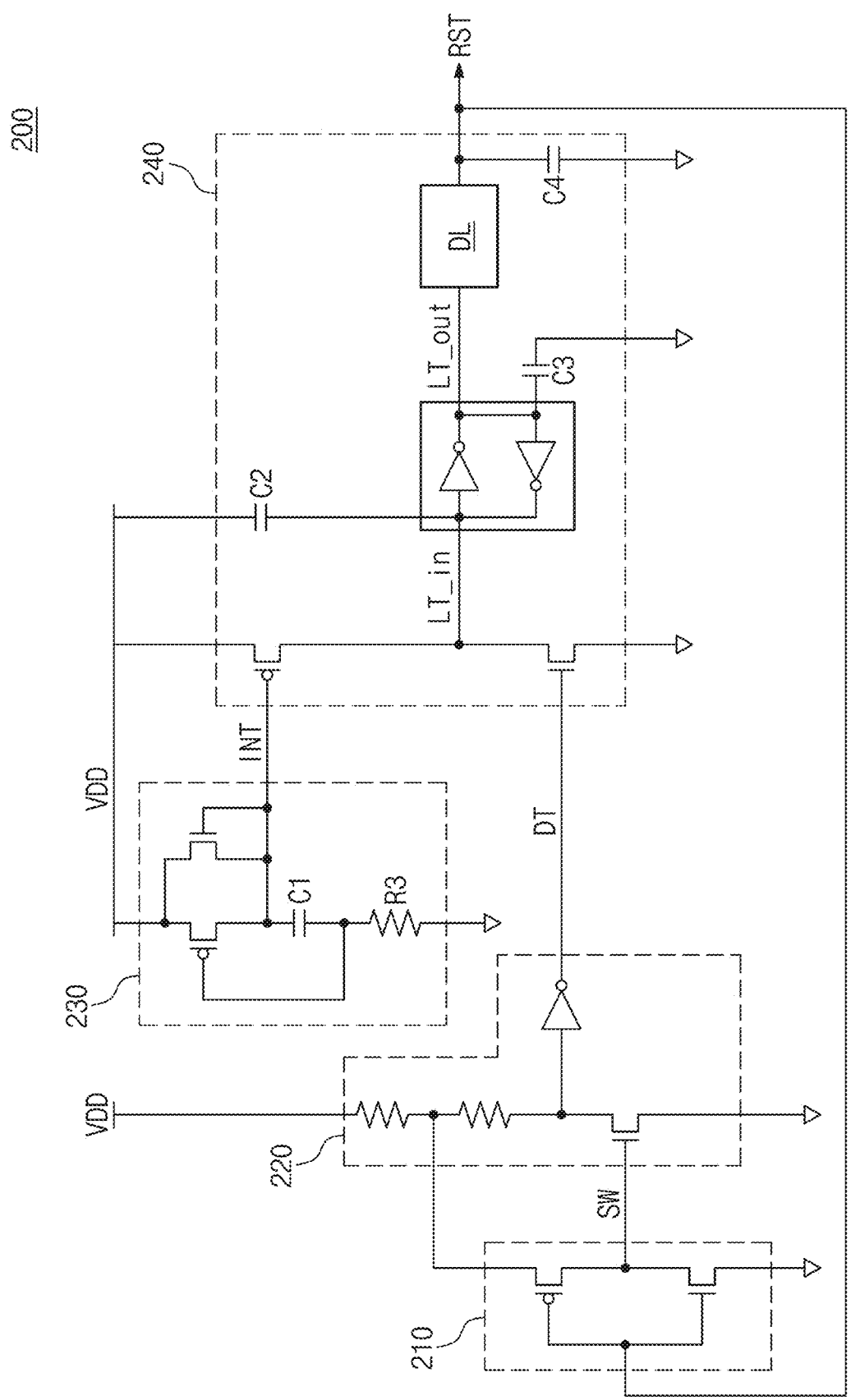
FIG. 6 is a circuit diagram illustrating a voltage monitoring device according to an example embodiment of the inventive concepts.

FIG. 6 is a circuit diagram illustrating a voltage monitoring device according to an example embodiment of the inventive concepts. For convenience of description, with regard to the components described with reference to FIG. 3, additional description will be omitted to avoid redundancy. In addition, the same reference numerals as described with reference to FIG. 3 are omitted from FIG. 6. Referring to FIG. 6, a voltage monitoring device 200 may include a switching circuit 210, a voltage detecting circuit 220, an initializing circuit 230, and an output circuit 240. The switching circuit 210 and the voltage detecting circuit 220 of FIG. 6 are similar to the switching circuit 110 and the voltage detecting circuit 120 of FIG. 3, and thus, additional description will be omitted to avoid redundancy.

Compared with the initializing circuit 130 of FIG. 3, the initializing circuit 230 of FIG. 6 may further include a third resistor R3. The third resistor R3 may be connected between the first capacitor C1 and the ground node. A gate of the second PMOS transistor MP2 of the initializing circuit 230 may be connected to a node between the first capacitor C1 and the third resistor R3.

Compared with the output circuit 140 of FIG. 3, the output circuit 240 of FIG. 6 may further include a second capacitor C2, a third capacitor C3, and a fourth capacitor C4. The second capacitor C2 may be connected between the power node and the latch input node LT_in. The third capacitor C3 may be connected between the latch output node LT_out and the ground node. The fourth capacitor C4 may be connected between an output node from which the reset signal RST is output and the ground node.

In an example embodiment, the third resistor R3 and the second to fourth capacitors C2 to C4 may provide a function of improving the reliability of operation of the voltage monitoring device 200. For example, the third resistor R3 may provide a function of improving the reliability of a signal that is provided to a gate of the second PMOS transistor MP2. The second capacitor C2 may be helpful for an input level of the latch LT to become logic high "HIGH" in the initial period of the power supply voltage VDD by increasing a level of the latch input node LT_in together depending on an increasing speed of the power supply voltage VDD. The third capacitor C3 may have a function of improving the reliability of a level of the latch output node LT_out. For example, the third capacitor C3 may be helpful to maintain the level of the latch output node LT_out at logic low "LOW" in the initial period of the power supply voltage VDD. The fourth capacitor C4 may have a function of improving the reliability of a level of the reset signal RST. For example, the fourth capacitor C4 may be helpful to maintain the level of the reset signal RST at logic low "LOW" in the initial period of the power supply voltage VDD. That is, the second to fourth capacitors C2 to C4 may be helpful to maintain a signal level of each node such that the first PMOS transistor MP1 of the switching circuit 210 is turned on in the initial period of the power supply voltage VDD.

As described above, the voltage monitoring device 200 according to an example embodiment of the inventive concepts may improve the reliability of operation by using various passive elements (e.g., a resistor, a capacitor, etc.). In an example embodiment, the circuit diagram illustrated in FIG. 6 is an example, and the inventive concepts are not limited thereto. For example, a voltage monitoring device according to an example embodiment of the inventive concepts may further include any other elements in addition to elements illustrated in drawings or may not include all or a part of passive elements illustrated in drawings.

Figure 7:
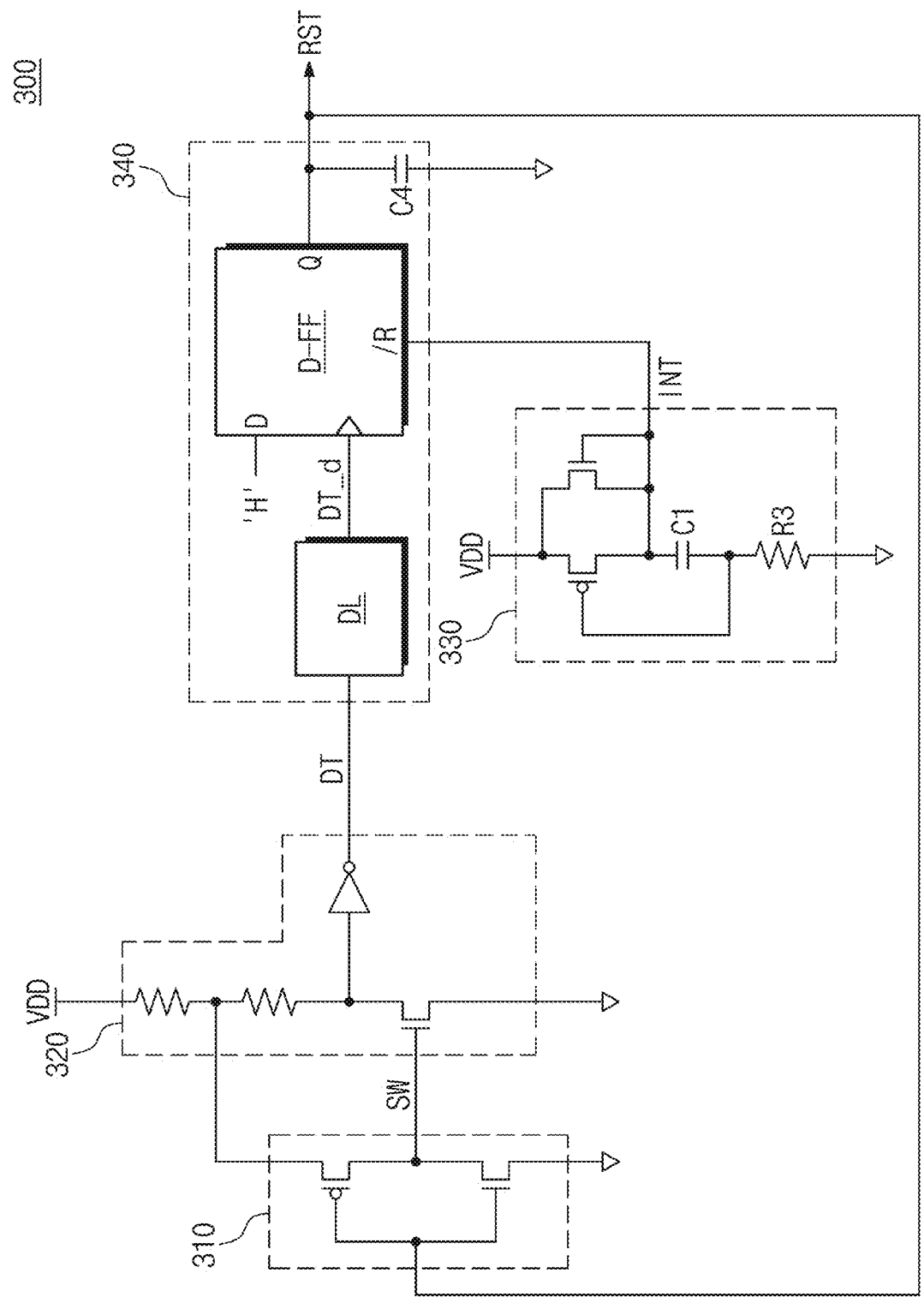
FIG. 7 is a circuit diagram illustrating a voltage monitoring device according to an example embodiment of the inventive concepts.

FIG. 7 is a circuit diagram illustrating a voltage monitoring device according to an example embodiment of the inventive concepts.

Referring to FIG. 7, a voltage monitoring device 300 may include a switching circuit 310, a voltage detecting circuit 320, an initializing circuit 330, and an output circuit 340. The switching circuit 310, the voltage detecting circuit 320, and the initializing circuit 330 of FIG. 7 are similar to the switching circuit 110, the voltage detecting circuit 120, and the initializing circuit 130 of FIG. 3, and thus, additional description will be omitted to avoid redundancy.

The output circuit 340 may include the delay unit DL, a flip-flop D-FF, and the fourth capacitor C4. The delay unit DL may delay the detection signal DT from the voltage detecting circuit 320 as much as a delay time and may output a delayed detection signal DT_d.

The flip-flop D-FF may receive a signal "H" of a high level through an input terminal "D", may receive the delayed detection signal DT_d through a clock terminal, and may receive the initialization signal INT through a reset terminal /R. The flip-flop D-FF may output the reset signal RST through an output terminal "Q" based on the received signals.

For example, the flip-flop D-FF may output a signal (i.e., the signal "H" of a high level) received through the input terminal "D" as the reset signal RST through the output terminal "Q" in response to a rising edge of the delayed detection signal DT_d. The flip-flop D-FF may reset the reset signal RST output through the output terminal "Q" in response to the initialization signal INT from the initializing circuit 330 (i.e., may set the reset signal RST to a low level "LOW").

The fourth capacitor C4 may be connected between the output terminal "Q" of the flip-flop D-FF and the ground node. In an example embodiment, as described above, the fourth capacitor C4 or the third resistor R3 of the initializing circuit 330 may be omitted.

In an example embodiment, as described above, the initializing circuit 330 may output the initialization signal INT. In the initial period of the power supply voltage VDD, the flip-flop D-FF may reset the reset signal RST to the low level "LOW" in response to the initialization signal INT. Operations that the switching circuit 310 and the voltage detecting circuit 320 performs in response to the reset signal RST of the low level "LOW" may be similar to the operations described above; when the power supply voltage VDD reaches a particular level, the voltage detecting circuit 320 may output the detection signal DT of logic high "HIGH".

The delay unit DL of the output circuit 340 may delay the detection signal DT of logic high "HIGH" as much as a delay time and may output the delayed detection signal DT_d. The flip-flop D-FF may output the signal "H" of the input terminal "D" as the reset signal RST in response to a rising edge of the delayed detection signal DT_d. In this case, the reset signal RST may increase to logic high "HIGH", and next operations of the switching circuit 310 and the voltage detecting circuit 320 (i.e., a configuration in which an operation of the voltage detecting circuit 320 is stopped) are described above, and thus, additional description will be omitted to avoid redundancy.

Figure 8A:
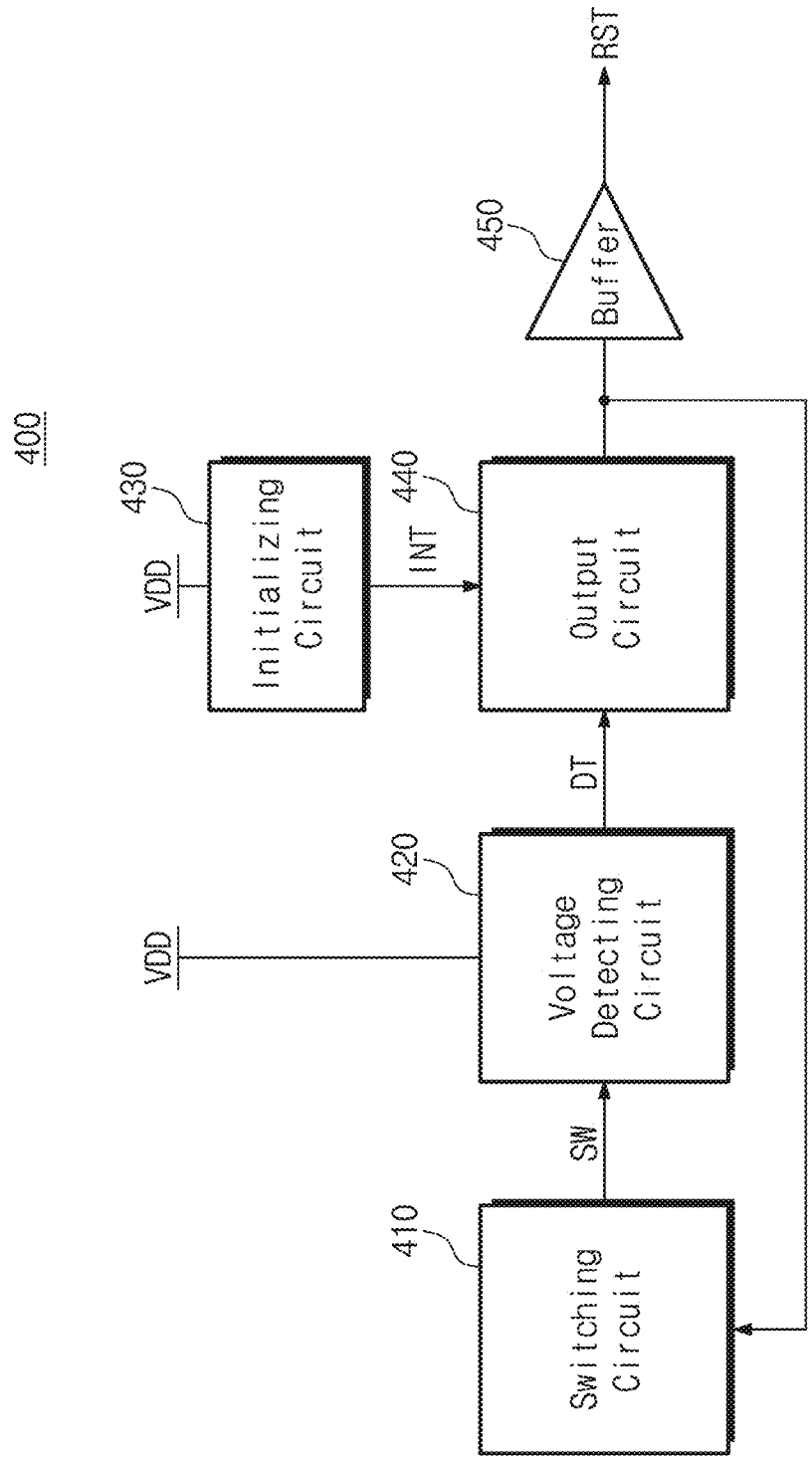
FIGS. 8A and 8B are block diagrams illustrating voltage monitoring devices according to embodiments of the inventive concepts.
Figure 8B:
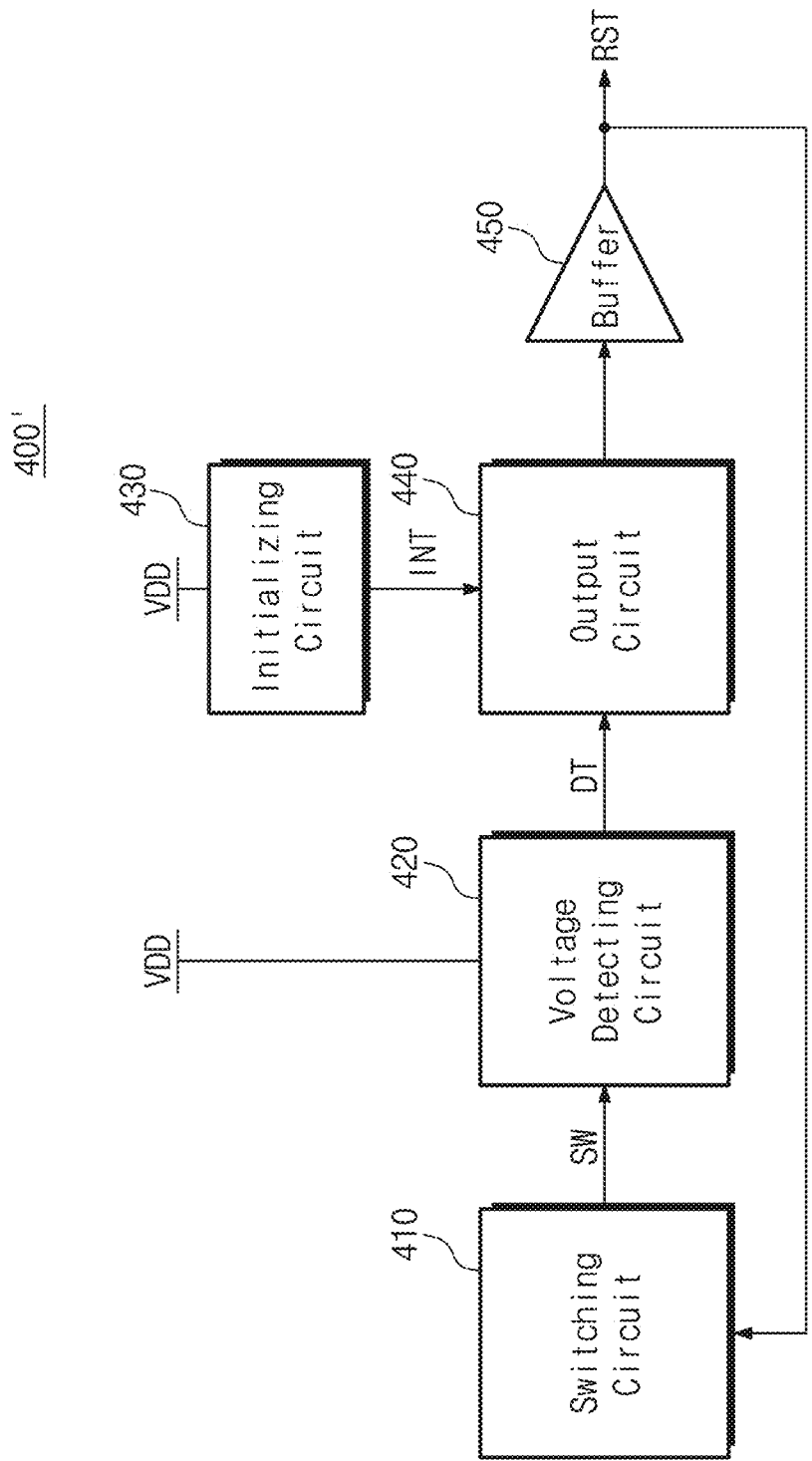

FIGS. 8A and 8B are block diagrams illustrating voltage monitoring devices according to embodiments of the inventive concepts.

Referring to FIGS. 8A and 8B, a voltage monitoring device 400 or 400' may include a switching circuit 410, a voltage detecting circuit 420, an initializing circuit 430, an output circuit 440, and a buffer 450. The switching circuit 410, the voltage detecting circuit 420, the initializing circuit 430, and the output circuit 440 of FIG. 8A or 8B are similar to the switching circuits 110, 210, and 310, the voltage detecting circuits 120, 220, and 320, the initializing circuits 310, 320, and 330, and the output circuits 410, 420, and 430 of FIGS. 2, 3, 5, 6, and 7, and thus, additional description will be omitted to avoid redundancy.

Compared to the above embodiments, the voltage monitoring device 400 or 400' of FIG. 8A or 8B may further include the buffer 450. The buffer 450 may be configured to buffer the reset signal RST. For example, the reset signal RST that is output from the voltage monitoring device 400 or 400' may be provided to various function blocks of an electronic device (refer to FIG. 1) in which the voltage monitoring device 400 or 400' is included. The function blocks may recognize that the power supply voltage VDD reaches a particular level, in response to the reset signal RST, and may perform various operations by using the power supply voltage VDD reaching the particular level.

That is, a waveform of the reset signal RST may be changed depending on a structure or the number of function blocks at the back of the voltage monitoring device 400 or 400'. In this case, the buffer 450 may be configured to inhibit (or, alternatively, prevent) the waveform of the reset signal RST from being changed due to various function blocks.

In an example embodiment, the reset signal RST that is fed back to the switching circuit 410 may be provided from an input of the buffer 450 as illustrated in FIG. 8A or may be provided from an output of the buffer 450 as illustrated in FIG. 8B.

In an example embodiment, in the embodiments of FIGS. 8A and 8B, one buffer 450 is illustrated, but the inventive concepts are not limited thereto. For example, the voltage monitoring device 400 or 400' may further include additional buffers.

Figure 9A:
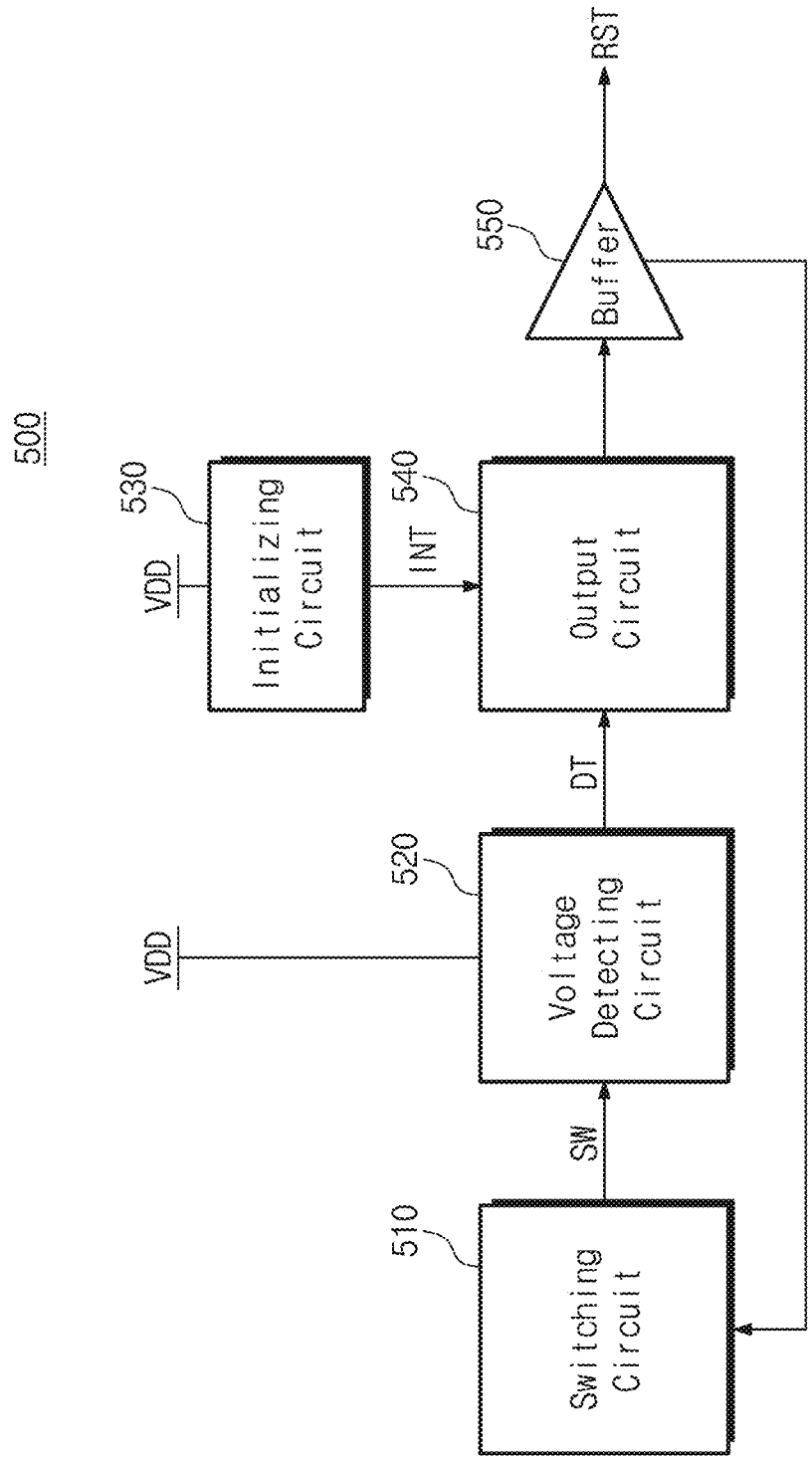
FIGS. 9A and 9B are diagrams illustrating a voltage monitoring device according to embodiments of the inventive concepts.
Figure 9B:
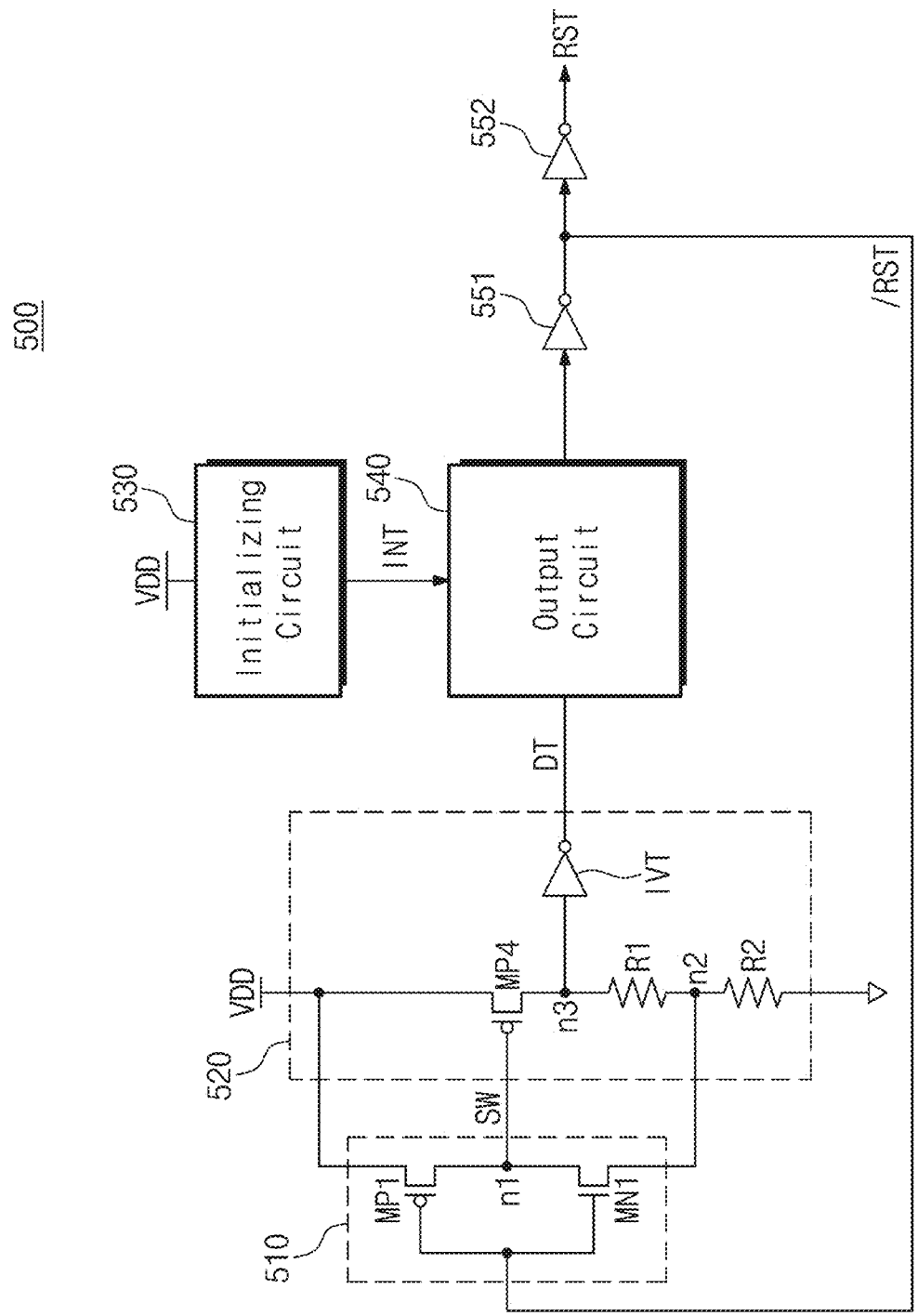

FIGS. 9A and 9B are diagrams illustrating a voltage monitoring device 500 according to embodiments of the inventive concepts. Referring to FIGS. 9A and 9B, a voltage monitoring device 500 may include a switching circuit 510, a voltage detecting circuit 520, an initializing circuit 530, an output circuit 540, and a buffer 550.

The initializing circuit 530 and the output circuit 540 of FIG. 9A or 9B are similar to the initializing circuits 310, 320, 330, and 430 and the output circuits 410, 420, 430, and 440 of FIGS. 2, 3, 5, 6, 7, 8A, and 8B, and thus, additional description will be omitted to avoid redundancy.

A polarity of the switching circuit 510 and the voltage detecting circuit 520 of FIGS. 9A and 9B may be opposite to a polarity of the switching circuits 110, 210, 310, and 410 and the voltage detecting circuits 120, 220, 320, and 420 described above. For example, as illustrated in FIG. 9B, the switching circuit 510 may include the first PMOS transistor MP1 and the first NMOS transistor MN1. The first PMOS transistor MP1 may be connected between a power node to which the power supply voltage VDD is applied and a first node n1, and may operate in response to an inverted reset signal/RST. The first NMOS transistor MN1 may be connected between the first node n1 and a second node n2 and may operate in response to an inverted reset signal/RST.

The voltage detecting circuit 520 may include a fourth PMOS transistor MP4, a first resistor R1, a second resistor R2, and an inverter IVT. The fourth PMOS transistor MP4 may be connected between the power node and a third node n3 and may operate in response to the switching signal SW. The first resistor R1 may be connected between the third node n3 and the second node n2. The second resistor R2 may be connected between the second node n2 and the ground node. The inverter IVT may invert a signal of the third node n3 to output the detection signal DT.

Below, an operation of the voltage monitoring device 500 of FIG. 9B will be described. For example, as described above, in the initial period of the power supply voltage VDD, the output circuit 540 may output the reset signal RST of the low level "LOW" in response to the initialization signal INT of the initializing circuit 530. The reset signal RST output from the output circuit 540 may be output as a final reset signal RST through inverters 551 and 552. In this case, the inverter 551 may output the inverted reset signal/RST. That is, in the initial period of the power supply voltage VDD, the inverted reset signal/RST may have a high level "HIGH".

The first NMOS transistor MN1 of the switching circuit 510 may be turned on in response to the inverted reset signal/RST of the high level "HIGH". As such, the switching signal SW may be set to the ground voltage. The fourth PMOS transistor MP4 of the voltage detecting circuit 220 may be turned on in response to the switching signal SW of the ground voltage, and thus, a voltage of the third node n3 may increase by the power supply voltage VDD.

When the voltage of the third node n3 reaches a particular level (i.e., when the power supply voltage VDD reaches the particular level), the detection signal DT may be set to logic high "HIGH" by the inverter IVT. The output circuit 140 may output the reset signal RST of logic high "HIGH" in response to the detection signal DT of logic high "HIGH". As such, the inverted reset signal /RST may be set to logic low "LOW".

The first NMOS transistor MN1 may be turned off in response to the inverted reset signal /RST of logic low "LOW", and the first PMOS transistor MP1 may be turned on in response to the inverted reset signal /RST of logic low "LOW". As the first PMOS transistor MP1 is turned on, the switching signal SW may increase to the power supply voltage VDD, and the fourth PMOS transistor MP4 of the voltage detecting circuit 520 may be turned off in response to the switching signal SW. That is, as the reset signal RST increases to logic high "HIGH" (or as the inverted reset signal /RST decreases to logic low "LOW"), the operation of the voltage detecting circuit 220 may be stopped.

As described above, a voltage monitoring device according to an example embodiment of the inventive concepts may maintain the reset signal RST at a particular level (e.g., a low level LOW) in the initial period of the power supply voltage VDD. As such, there may be secured the reliability of operation of the switching circuit 510 in the initial period of the power supply voltage VDD. Also, in the stable period of the power supply voltage VDD, as the operation of the voltage detecting circuit 520 is stopped, current consumption of the voltage detecting circuit 520 may be prevented. As such, power consumption may decrease in the stable period of the power supply voltage VDD. Accordingly, a voltage monitoring device improving reliability and reducing power consumption may be provided.

In an example embodiment, an example is illustrated in FIG. 9B as the inverted reset signal /RST is generated by the inverter 551 in the buffer 550, but the inventive concepts are not limited thereto. For example, although not illustrated clearly in drawings, the switching circuit 510 may further include an additional inverter configured to invert the reset signal RST (e.g., from the output circuit 540 or from the buffer 550) to generate the inverted reset signal /RST.

Figure 10:
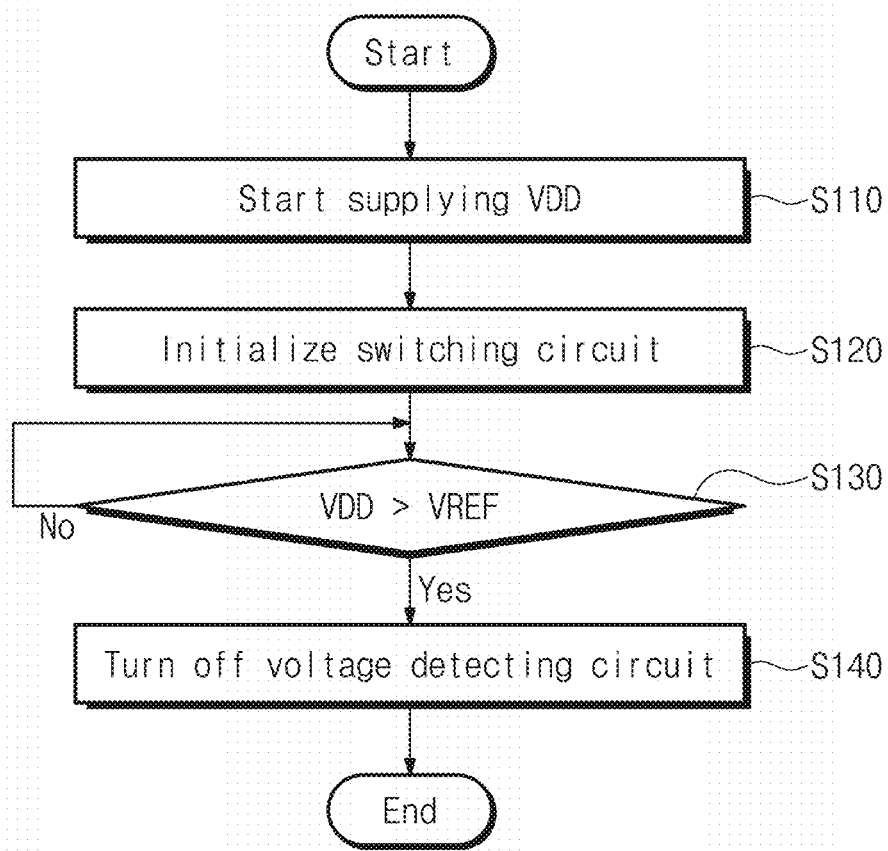
FIG. 10 is a flowchart illustrating an operation of a voltage monitoring device according to an example embodiment of the inventive concepts.

FIG. 10 is a flowchart illustrating an operation of a voltage monitoring device according to an example embodiment of the inventive concepts. For convenience of description, the flowchart of FIG. 10 will be described with reference to the voltage monitoring device 100 of FIG. 2. However, the inventive concepts are not limited thereto. For example, operations according to the flowchart of FIG. 10 may be performed by various voltage monitoring devices according to example embodiments of the inventive concepts.

Referring to FIGS. 2 and 10, in operation S110, the voltage monitoring device 100 may be provided with the power supply voltage VDD. For example, the power supply voltage VDD that is provided to the voltage monitoring device 100 may start to increase from 0 V.

In operation S120, the voltage monitoring device 100 may initialize the switching circuit 110. For example, as described above, in the initial period of the power supply voltage VDD, the initializing circuit 130 of the voltage monitoring device 100 may output the initialization signal INT, and the output circuit 140 may output the reset signal RST of the logic low "LOW" in response to the initialization signal INT. The switching circuit 110 may be initialized in response to the switching signal SW of logic low "LOW". In an example embodiment, as described above, the initialization of the switching circuit 110 may indicate an operation that allows the switching circuit 110 to generate the switching signal SW accurately in the initial period of the power supply voltage VDD.

In operation S130, the voltage monitoring device 100 may determine whether the power supply voltage VDD reaches a particular voltage VC. When the power supply voltage VDD does not reach the particular voltage VC, the voltage monitoring device 100 may continue to perform operation S130; when the power supply voltage VDD reaches the particular voltage VC, the voltage monitoring device 100 may perform operation S140. Alternatively, in operation S130, the voltage monitoring device 100 may determine whether the power supply voltage VDD reaches the reference voltage VREF. When the power supply voltage VDD does not reach the reference voltage VREF, the voltage monitoring device 100 may continue to perform operation S130; when the power supply voltage VDD reaches the reference voltage VREF, the voltage monitoring device 100 may perform operation S140.

In an example embodiment, as described above, the switching signal SW may be a signal corresponding to the power supply voltage VDD. In other words, the switching signal SW may be a voltage that is obtained by dividing the power supply voltage VDD through the first and second resistors R1 and R2 of the voltage detecting circuit 120. That is, that the power supply voltage VDD reaches the particular voltage VC may mean that the switching signal SW reaches the reference voltage VREF; in contrast, that the power supply voltage VDD does not reach the particular voltage VC may mean that the switching signal SW does not reach the reference voltage VREF.

In operation S140, the voltage monitoring device 100 may stop the operation of the voltage detecting circuit 120. For example, as described above, the output circuit 140 of the voltage monitoring device 100 may output the reset signal RST of logic high "HIGH" in response to the detection signal DT of logic high "HIGH". The switching signal SW of the switching circuit 110 may be set to a ground level in response to the reset signal RST of logic high "HIGH", and thus, the second NMOS transistor MN2 of the switching circuit 110 may be turned off. As such, current consumption of the voltage detecting circuit 120 may be prevented. In other words, power consumption of the voltage monitoring device 100 may decrease in the initial period of the power supply voltage VDD.

Figure 11A:
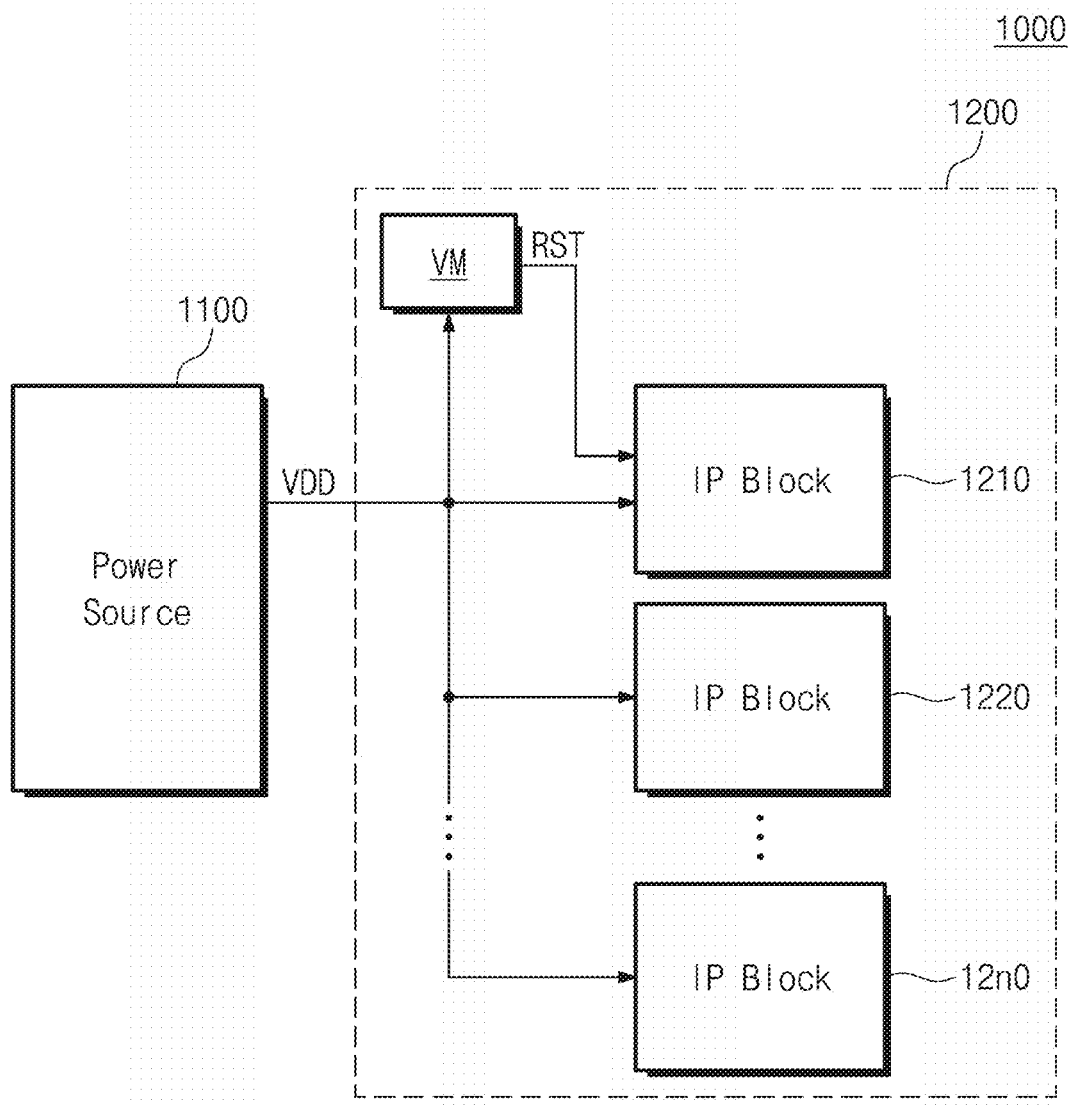
FIGS. 11A to 11C are block diagrams illustrating various user systems to which a voltage monitoring device according to an example embodiment of the inventive concepts are applied.
Figure 11B:
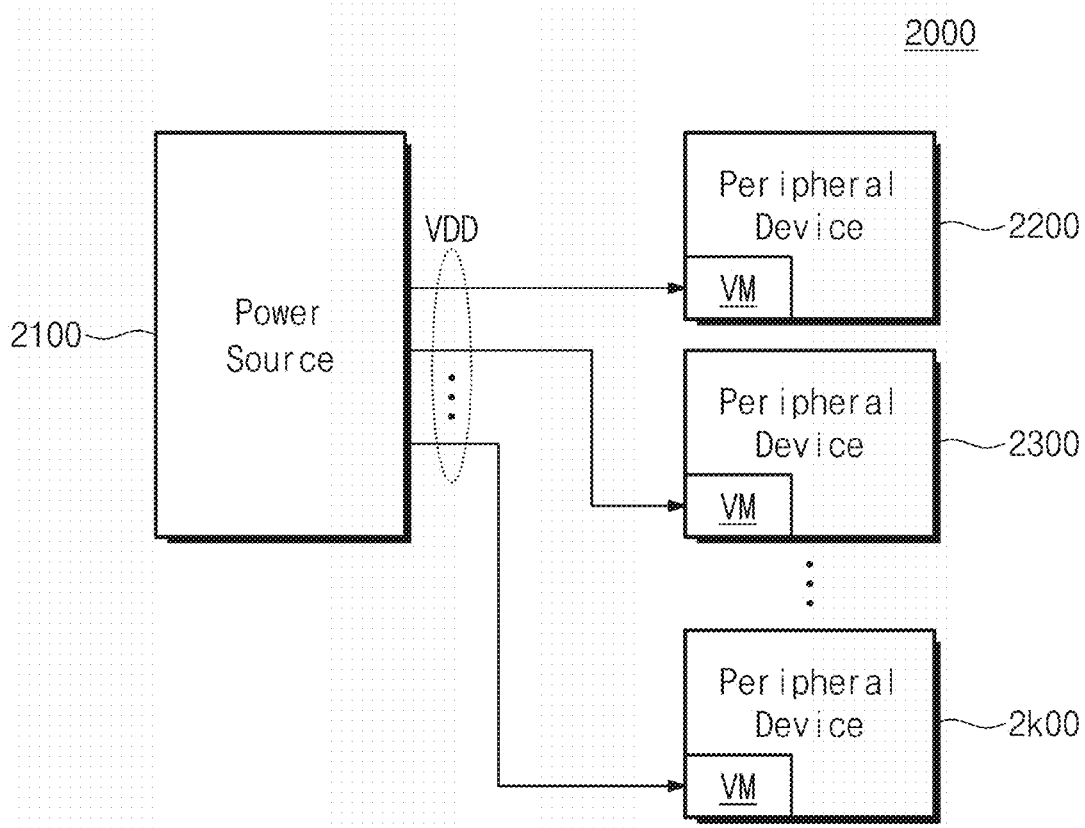
Figure 11C:
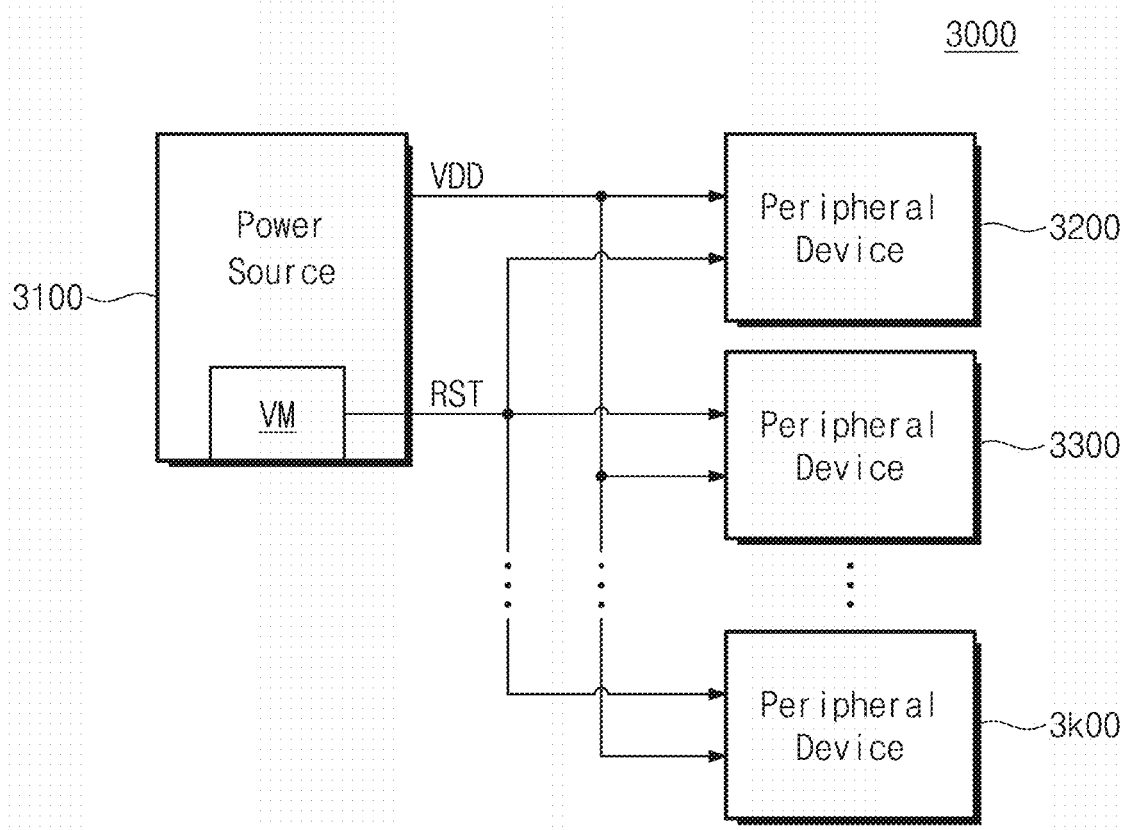

FIGS. 11A to 11C are block diagrams illustrating various user systems to which a voltage monitoring device according to an example embodiment of the inventive concepts are applied. Referring to FIG. 11A, a user system 1000 may include a power source 1100 and an electronic device 1200. The power source 1100 may be configured to provide the power supply voltage VDD.

The electronic device 1200 may include a plurality of function blocks 1210 to 12n0 (e.g., intellectual property (IP) blocks) and a voltage monitoring device VM. In an example embodiment, the electronic device 1200 may include hardware components, which are configured to perform various functions or operations, such as an application processor (AP) and a modem. Each of the plurality of function blocks 1210 to 12n0 may be configured to perform various functions or operations by using the power supply voltage VDD from the power source 1100.

The voltage monitoring device VM may be one of various voltage monitoring devices described above. For example, the voltage monitoring device VM may monitor a level of the power supply voltage VDD provided from the power source 1100, and the voltage monitoring device VM may output the reset signal RST when the power supply voltage VDD reaches a particular level. In an example embodiment, each of the plurality of function blocks 1210 to 12n0 may initiate various functions or operations in response to the reset signal RST. In an example embodiment, the electronic device 1200 may be implemented with one semiconductor chip, one semiconductor die, one semiconductor package, or one semiconductor module.

Referring to FIG. 11B, a user system 2000 may include a power source 2100 and a plurality of peripheral devices 2200 to 2k00. The power source 2100 may be configured to provide the power supply voltage VDD.

Each of the plurality of peripheral devices 2200 to 2k00 may be a device configured to perform various functions by using the power supply voltage VDD from the power source 2100. In an example embodiment, each of the plurality of peripheral devices 2200 to 2k00 may be separate hardware devices such as an AP, a modem, a CPU, and a GPU. The plurality of peripheral devices 2200 to 2k00 may include the voltage monitoring devices VM, respectively. The voltage monitoring device VM may be one of voltage monitoring devices described above, and thus, additional description will be omitted to avoid redundancy.

Referring to FIG. 11C, a user system 3000 may include a power source 3100 and a plurality of peripheral devices 3200 to 3k00. The power source 3100 may be configured to provide the power supply voltage VDD. The power source 3100 may include the voltage monitoring device VM. The voltage monitoring device VM may be one of voltage monitoring devices described above. For example, the voltage monitoring device VM may monitor the power supply voltage VDD to be provided to the outside, and the voltage monitoring device VM may output the reset signal RST when the power supply voltage VDD reaches a particular level. Each of the plurality of peripheral devices 3200 to 3k00 may be configured to perform various functions or operations in response to the power supply voltage VDD and the reset signal RST from the power source 3100.

As described above, a voltage monitoring device according to an example embodiment of the inventive concepts may be applied to various electronic devices in various manners. For example, a voltage monitoring device may be include in each of various electronic devices or may be implemented with a hardware component independent of various electronic devices. However, the inventive concepts are not limited thereto.

Figure 12:
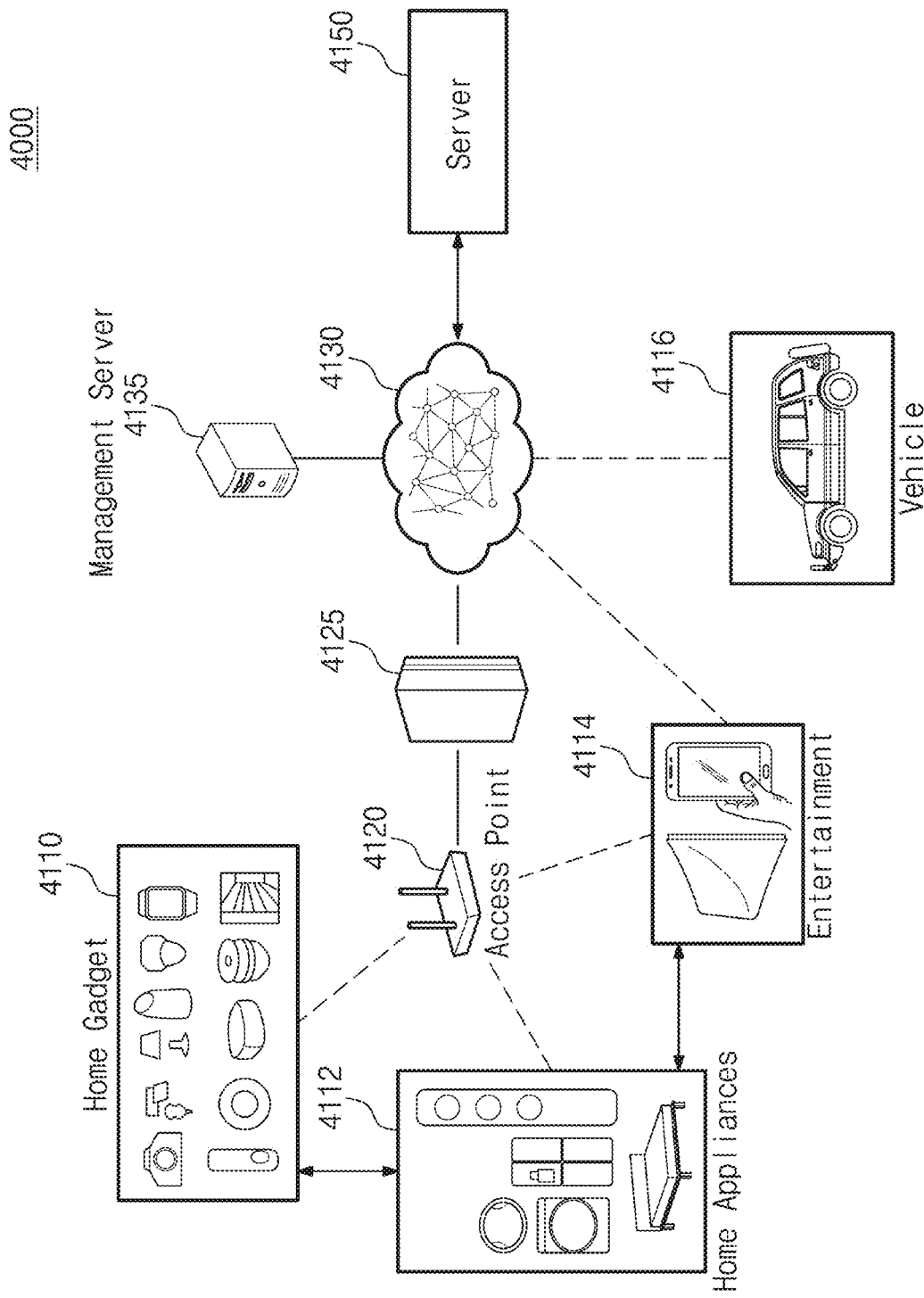
FIG. 12 is a diagram illustrating an IoT system to which a voltage monitoring device according to an example embodiment of the inventive concepts are applied.

FIG. 12 is a diagram illustrating an IoT system to which a voltage monitoring device according to an example embodiment of the inventive concepts are applied.

Referring to FIG. 12, an IoT network system 4000 may include various components.

An Internet of Things (IoT) may refer to a network between things that use wired and/or wireless communication. In an example embodiment, an IoT may be referred to as an "IoT network system", a "ubiquitous sensor network (USN) communication system", a "machine type communication (MTC) system", a "machine-oriented communication (MOC) system", a "machine-to-machine (M2M) communication system", or a "device-to-device (D2D) communication system". An IoT network system to be mentioned in the present disclosure may include an IoT device, an access point (AP), a gateway, a communication network, a server, etc.

However, these components are defined to describe the IoT network system, and the scope of the IoT network system is not limited thereto. Also, the IoT network system may use an application protocol, such as a user datagram protocol (UDP), a transmission protocol such as a transmission control protocol (TCP), an IPv6 low-power wireless personal area networks (6LoWPAN) protocol, an IPv6 Internet routing protocol, a constrained application protocol (CoAP), a hypertext transfer protocol (HTTP), a message queue telemetry transport (MQTT), or an MQTT for sensors networks (MQTT-S), for the purpose of information exchange (or communication) between two or more components therein.

In a wireless sensor network (WSN), each of a plurality of IoT devices 4110, 4112, 4114, and 4116 may be used as a sink node or a sensor node. The sink node is called a "base station" and may function as a gateway connecting the WSN with an external network (e.g., the Internet). The sink node may assign a task to each sensor node and may gather events sensed by the respective sensor nodes. The sensor node may be a node within the WSN, which may process and gather sensory information, and the sensor node may be a node which may perform communication between nodes connected within the WSN.

The plurality of IoT devices 4110, 4112, 4114, and 4116 may include an active IoT device that operates by using its own power and a passive IoT device that operates by using a power wirelessly transmitted from the outside. The active IoT device may include a refrigerator, an air conditioner, a telephone, a vehicle, etc. The passive IoT device may include a radio frequency identification (RFID) tag or a near field communication (NFC) tag. In an example embodiment, because each of the plurality of IoT devices 4110, 4112, 4114, and 4116 operates based on its own power or a wireless power, each of the plurality of IoT devices 4110, 4112, 4114, and 4116 may be an ultra-low power based device. In an example embodiment, each of the plurality of IoT devices 4110, 4112, 4114, and 4116 may include a voltage monitoring device described with reference to FIGS. 1 to 11C. That is, each of the plurality of IoT devices 4110, 4112, 4114, and 4116 may interrupt an operation of a voltage detecting circuit in the stable period of the power supply voltage VDD, thus reducing power consumption. For this reason, an ultra-low power based operation may be implemented in each of the plurality of IoT devices 4110, 4112, 4114, and 4116.

For another example, the IoT devices 4110, 4112, 4114, and 4116 may include a passive communication interface such as a QR code, an RFID tag, or an NFC tag or may include an active communication interface such as a modem or a transceiver.

The IoT devices 4110, 4112, 4114, and 4116 may collect data by using a sensor or may transmit the collected data to the outside through a wired/wireless communication interface. Also, the IoT devices 4110, 4112, 4114, and 4116 may transmit and/or receive control information and/or data through the wired/wireless communication interface. The wired/wireless communication interface may be one of accessible interfaces.

The IoT network system 4000 may function as an access point 4120. Through the access point 4120, the plurality of IoT devices 4110, 4112, 4114, and 4116 may be connected to a communication network or may be connected to other IoT devices. The access point 4120 may be embedded in one IoT device. For example, the access point 4120 may be embedded in a television. In this case, a user may be allowed to monitor or control at least one IoT device connected to the access point 4120 through a display of the television. Also, the access point 4120 may be included in one IoT device. For example, a smartphone may be the access point 4120 that is an IoT device and is connected to any other IoT device. In this case, the smartphone may be connected to a communication network through a mobile communication network or a short-range wireless network.

The IoT network system 4000 may include a gateway 4125. The gateway 4125 may change a protocol such that the access point 4120 is connected to an external communication network (e.g., the Internet or a public switched network). The IoT devices 4110, 4112, and 4114 may be connected to an external communication network through the gateway 4125. In some embodiments, the gateway 4125 may be integrally implemented in the access point 4120. Alternatively, the access point 4120 may perform a function of a first gateway, and the gateway 4125 may perform a function of a second gateway.

The gateway 4125 may be included in one of IoT devices. For example, a smartphone may be the gateway 4125 that is an IoT device and is connected to any other IoT device. In this case, the smartphone may be connected to a mobile cellular network.

The IoT network system 4000 may include at least one communication network 4130. The communication network 4130 may include the Internet and/or a public switched network. The public switched network may include a mobile cellular network. The communication network 4130 may be a channel through which information collected by the IoT devices 4110, 4112, 4114, and 4116.

The IoT network system 4000 may include a server 4150 connected to the communication network 4130. The communication network 4130 may transmit data sensed by the IoT devices 4110, 4112, 4114, and 4116 to the server 4150. The server 4150 may store or analyze the transmitted data. Also, the server 4150 may transmit an analyzed result through the communication network 4130. The server 4150 may store information associated with at least one of the IoT devices 4110, 4112, 4114, and 4116, and the server 4150 may analyze data transmitted from an associated IoT device based on the stored information. Also, the server 4150 may transmit the analyzed result to an associated IoT device or a user device through a communication network.

According to embodiments of the inventive concept, a voltage monitoring device may include a switching circuit, a voltage detecting circuit, an initializing circuit, and an output circuit. As the initializing circuit maintains a level of a reset signal at a particular level in an initial period of a power supply voltage, there may be secured the reliability of operation of the switching circuit.

Also, in a stable period of the power supply voltage, as an operation of the voltage detecting circuit is stopped, current consumption of the voltage detecting circuit may be prevented. Accordingly, a voltage monitoring device improving reliability and reducing power consumption and an electronic device including the same are provided.

While example embodiments of the inventive concepts have been described with reference to example embodiments thereof, it will be apparent to those of ordinary skill in the art that various changes and modifications may be made thereto without departing from the spirit and scope of the inventive concepts as set forth in the following claims.

What is claimed is:

1. A voltage monitoring circuit comprising:
   an initializing circuit configured to generate an initialization signal by delaying a power supply voltage by a first delay time;
   a switching circuit configured to generate a switching signal in response to a reset signal;
   a voltage detecting circuit configured to perform an operation to generate a detection signal in response to an increase in the power supply voltage to a set level, and to thereafter stop the operation in response to the switching signal; and
   an output circuit configured to generate the reset signal in response to the initialization signal and the detection signal.

2. The voltage monitoring circuit of claim 1, wherein the initializing circuit is an RC-delay circuit configured to RC-delay the power supply voltage by the first delay time.

3. The voltage monitoring circuit of claim 1, wherein the voltage detecting circuit is configured to stop the operation in response to the switching signal such that the detection signal generated by the voltage detection circuit transitions to logic high in response to the switching signal reaching a reference voltage.

4. The voltage monitoring circuit of claim 3, wherein the output circuit is configured to generate the reset signal based on the initialization signal and the detection signal such that, the reset signal transitions to logic high, after a second delay time elapses from a time when the detection signal transitions to the logic high.

5. The voltage monitoring circuit of claim 4, wherein
   the switching circuit is configured to output the switching signal of a logic low in response to the reset signal of the logic high, and
   the voltage detecting circuit is configured to stop the operation in response to the switching signal of the logic low.

6. The voltage monitoring circuit of claim 1, wherein the initializing circuit includes:
   a first PMOS transistor connected between a power node receiving the power supply voltage and an initialization signal node from which the initialization signal is output, the first PMOS transistor configured to operate in response to a level of a ground node;
   a first capacitor connected between the initialization signal node and the ground node; and
   a first NMOS transistor connected between the power node and the initialization signal node, the first NMOS transistor configured to operate in response to the initialization signal.

7. The voltage monitoring circuit of claim 1, wherein the switching circuit includes:
   a first PMOS transistor connected between a first node from which the switching signal is output and a second node associated with the voltage detecting circuit; and
   a first NMOS transistor connected between the first node and a ground node, the first NMOS transistor configured to operate in response to the reset signal.

8. The voltage monitoring circuit of claim 7, wherein the voltage detecting circuit includes:
   a first resistor connected between a power node receiving the power supply voltage and the second node connected to the first PMOS transistor;
   a second resistor connected between the second node and a third node;
   a second NMOS transistor connected between the third node and the ground node, the second NMOS transistor configured to operate in response to the switching signal; and
   an inverter configured to output the detection signal in response to a level of the third node.

9. The voltage monitoring circuit of claim 1, wherein the output circuit includes:
   a first PMOS transistor connected between a power node receiving the power supply voltage and a latch input node, the first PMOS transistor configured to operate in response to the initialization signal;

a first NMOS transistor connected between the latch input node and a ground node, the first NMOS transistor configured to operate in response to the detection signal;
a latch connected between the latch input node and a latch output node; and
a delay unit configured to generate the reset signal by delaying a signal of the latch output node by a second delay time.

10. The voltage monitoring circuit of claim 9, wherein the output circuit further includes:
a first capacitor connected between the power node and the latch input node;
a second capacitor connected between the latch output node and the ground node; and
a third capacitor connected between a reset signal node from which the reset signal is output and the ground node.

11. The voltage monitoring circuit of claim 1, wherein the output circuit includes:
a delay unit configured to generate a delayed detection signal by delaying the detection signal by a second delay time; and
a flip-flop including an input terminal configured to receive a first signal, a clock terminal configured to receive the delayed detection signal, a reset terminal configured to receive the initialization signal, and an output terminal configured to output the reset signal.

12. The voltage monitoring circuit of claim 11, wherein the output circuit further includes a fourth capacitor connected between the output terminal and a ground node.

13. The voltage monitoring circuit of claim 1, wherein the switching circuit includes:
a first inverter configured to invert the reset signal to generate an inverted reset signal;
a first PMOS transistor connected between a power node receiving the power supply voltage and a first node from which the switching signal is output, the first PMOS transistor configured to operate in response to the inverted reset signal; and
a first NMOS transistor connected between the first node and a second node associated with the voltage detecting circuit, the first NMOS transistor configured to operate in response to the inverted reset signal, and wherein the voltage detecting circuit includes:
a first resistor connected between the second node and a third node;
a second PMOS transistor connected between the power node and the third node, the second PMOS transistor configured to operate in response to the switching signal;
a second resistor connected between the second node connected to the first NMOS transistor and a ground node; and
a second inverter configured to output the detection signal in response to a level of the third node.

14. A voltage monitoring circuit comprising:
a first PMOS transistor connected between a first node and a second node, the first PMOS transistor configured to operate in response to a reset signal;
a first NMOS transistor connected between the first node and a ground node, the first NMOS transistor configured to operate in response to the reset signal;
a first resistor connected between a power node receiving a power supply voltage and the second node;
a second resistor connected between the second node and a third node;
a second NMOS transistor connected between the third node and the ground node, the second NMOS transistor configured to operate in response to a level of the first node by turning on the second NMOS transistor in response to the level of the first node increasing to a set level, and thereafter turning off the second NMOS transistor in response to the level of the first node decreasing to ground;
an inverter configured to output a detection signal based on a level of the third node;
a second PMOS transistor connected between the power node and an initialization signal node outputting an initialization signal, the second PMOS transistor configured to operate in response to a level of a fourth node;
a first capacitor connected between the initialization signal node and the fourth node;
a third NMOS transistor connected between the power node and the initialization signal node, the third NMOS transistor configured to operate in response to the initialization signal; and
an output circuit configured to output the reset signal in response to the initialization signal and the detection signal.

15. The voltage monitoring circuit of claim 14, wherein the output circuit includes:
a third PMOS transistor connected between the power node and a latch input node, the third PMOS transistor configured to operate in response to the initialization signal;
a fourth NMOS transistor connected between the latch input node and the ground node, the fourth NMOS transistor configured to operate in response to the detection signal;
a latch connected between the latch input node and a latch output node; and
a delay unit configured to generate the reset signal by delaying a signal of the latch output node by a first delay time.

16. The voltage monitoring circuit of claim 15, further comprising:
a second capacitor connected between the power node and the latch input node;
a third capacitor connected between the latch output node and the ground node; and
a fourth capacitor connected between an output node from which the reset signal is output and the ground node.

17. The voltage monitoring circuit of claim 14, wherein the output circuit includes:
a delay unit configured to generate a delayed detection signal by delaying the detection signal by a first delay time; and
a flip-flop configured to receive a first signal through an input terminal, to receive the delayed detection signal through a clock terminal, to receive the initialization signal through a reset terminal, and to output the reset signal through an output terminal based on the first signal, the delayed detection signal, and the initialization signal.

18. The voltage monitoring circuit of claim 17, further comprising:
a second capacitor connected between the output terminal and the ground node.

19. The voltage monitoring circuit of claim 14, further comprising:

a third resistor connected between the ground node and the fourth node.

20. An electronic device comprising:
a plurality of function blocks configured to operate based on a power supply voltage, in response to a reset signal; and
a voltage monitoring circuit configured to output the reset signal when the power supply voltage reaches a set level, the voltage monitoring circuit including,
   an initializing circuit configured to generate an initialization signal by delaying the power supply voltage by a first delay time,
   a switching circuit configured to generate a switching signal such that the switching signal corresponds to one of the power supply voltage or a ground voltage in response to the reset signal,
   a voltage detecting circuit configured to perform an operation to generate a detection signal in response to an increase in the power supply voltage to a set level associated with operation of the plurality of function blocks, and to thereafter stop the operation in response to the switching signal, and
   an output circuit configured to generate the reset signal in response to the initialization signal and the detection signal.

* * * * *